US007847479B2

(12) United States Patent
Satou et al.

(10) Patent No.: US 7,847,479 B2
(45) Date of Patent: Dec. 7, 2010

(54) ORGANIC ELECTROLUMINESCENCE ELEMENT

(75) Inventors: Tasuku Satou, Kanagawa (JP); Masaru Kinoshita, Kanagawa (JP); Manabu Tobise, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 160 days.

(21) Appl. No.: 12/177,951

(22) Filed: Jul. 23, 2008

(65) Prior Publication Data

US 2009/0026936 A1 Jan. 29, 2009

(30) Foreign Application Priority Data

Jul. 27, 2007 (JP) ............................ 2007-196677

(51) Int. Cl.
*H01J 1/62* (2006.01)

(52) U.S. Cl. ...................................... 313/506; 313/504

(58) Field of Classification Search ................. 313/504, 313/506

See application file for complete search history.

(56) References Cited

U.S. PATENT DOCUMENTS

2009/0026937 A1 * 1/2009 Kinoshita et al. ........... 313/504

FOREIGN PATENT DOCUMENTS

JP 2001-155862 A * 6/2001
JP 2004-6102 A * 1/2004

OTHER PUBLICATIONS

Kido et al., "Multilayer White Light-Emitting Organic Electroluminescent Device," Science, vol. 267, No. 3, 1995, pp. 1332-1334.*

* cited by examiner

*Primary Examiner*—Vip Patel
(74) *Attorney, Agent, or Firm*—Birch, Stewart, Kolash & Birch, LLP

(57) ABSTRACT

An organic electroluminescence element including an organic layer including a light-emitting layer between a pair of electrodes, wherein the light-emitting layer contains at least two light-emitting materials having different Ea values and at least one host material, a concentration of a light-emitting material having a larger Ea value in the light-emitting layer gradually decreases from a cathode side toward an anode side, and a concentration of a light-emitting material having a smaller Ea value in the light-emitting layer gradually decreases from the anode side toward the cathode side.

24 Claims, 1 Drawing Sheet

ORGANIC ELECTROLUMINESCENCE ELEMENT

CROSS-REFERENCE TO RELATED APPLICATION

This application claims priority under 35 USC 119 from Japanese Patent Application No. 2007-196677, the disclosure of which is incorporated by reference herein.

BACKGROUND OF THE INVENTION

1. Field of the Invention

The present invention relates to an organic electroluminescence element. In particular, the invention relates to an organic electroluminescence element with high light-emission efficiency and excellent durability.

2. Description of the Related Art

An organic electroluminescence element (hereinafter, referred to as an "organic EL element" in some cases) is composed of a light-emitting layer or a plurality of functional organic layers containing a light-emitting layer, and a pair of electrodes sandwiching these layers. The organic EL element is a device for obtaining luminescence by utilizing at least either one of luminescence from excitons each of which is obtained by recombining an electron injected from a cathode with a hole injected from an anode to produce the exciton in the light-emitting layer, or luminescence from excitons of other molecules produced by energy transmission from at least one of the above-described excitons.

Heretofore, an organic EL element has been developed by using a laminate structure from integrated layers in which each layer is functionally differentiated, whereby brightness and device efficiency are remarkably improved. For example, "Science", vol. 267, No. 3, page 1332, (1995) discloses a two-layer laminated type device obtained by laminating a hole transport layer and a light-emitting layer also functioning as an electron transport layer; a three-layer laminated type device obtained by laminating a hole transport layer, a light-emitting layer, and an electron transport layer; and a four-layer laminated type device obtained by laminating a hole transport layer, a light-emitting layer, a hole blocking layer, and an electron transport layer.

However, many problems such as improvement in light-emission efficiency, improvement in drive durability and so on still remain for putting an organic electroluminescence element to practical use. When light-emission efficiency in particular is improved, power consumption can reduced, and drive durability is also improved; accordingly, many means for improving light-emission efficiency have been disclosed. However, a light-emitting element in which light-emission efficiency is improved by means of disposing a charge blocking layer or the like generally has a disadvantage of short drive durability. On the other hand, in many cases, a light-emitting element that is excellent in drive durability has a disadvantage of low light-emission efficiency. That is, it is difficult to achieve both of improvement in light-emission efficiency and improvement in drive durability.

In order to increase light-emission efficiency of a light-emitting element, it is important that both charges injected in the light-emitting element recombine efficiently in a light-emitting layer to be converted to light. However, in general, some injected charges pass through the light-emitting element without encountering opposite charges to cause lowering of quantum yield of the light-emitting element. As a means for improving such a deterioration of quantum yield, Japanese Patent Application Laid-Open (JP-A) No. 2001-155862 discloses a means of providing a gradation in a concentration of materials which constitute a light-emitting layer in a thickness direction of the light-emitting layer. That is, in an element having a configuration wherein an electron transporting compound and a hole transporting compound are contained in a light-emitting layer, a concentration of the electron transporting compound decreases in a direction from a cathode to an anode, and a concentration of the hole transporting compound is increased in a direction from the cathode to the anode. Charges injected from the cathode proceed by hopping on the electron transporting compound. However, since the concentration of the electron transporting compound is reduced approaching the anode, movement is more restricted as charges approach the anode. Similarly, holes injected from the anode proceed by hopping on the hole transporting compound. However, since the concentration of the hole transporting compound is reduced approaching the cathode, movement is more restricted as charges approach the cathode. As a result, probability that the two charges will encounter each other is heightened, and thus, high quantum efficiency can be expected. Furthermore, speeds of both charges become slower little by little; accordingly, the recombination does not occur locally in the light-emitting layer, and excitons are generated in the entire light-emitting layer to emit light. Since the load of light emission is dispersed over the entire light-emitting layer, the drive durability can also be expected to improve.

However, the constitution of the concentration gradation described in JP-A No. 2001-155862 which includes an electron transporting material and a hole transporting material is difficult to optimize from a practical standpoint. This is because, in the configuration described in JP-A No. 2001-155862, for instance, when a host material is a hole transporting material and a light-emitting material is an electron transporting material, a region close to a cathode is constituted by the light-emitting material in an amount of 100%. It is known that, when the concentration of the light-emitting material is too high, the light-emission efficiency is extremely deteriorated. Accordingly, in many cases, the advantageous effect of the concentration gradation cannot be exerted.

On the other hand, a method of forming a gradation in which the concentration of a light-emitting material is not so high is proposed. For instance, JP-A No. 2004-6102 discloses a configuration in which a light-emitting layer is constituted by a host material and a light-emitting material, and the concentration gradation is formed so that a concentration of the light-emitting material does not become 100%. In this configuration, the light-emitting material is not contained in a high concentration, and efficiency deterioration due to concentration quenching is not caused; accordingly, the advantages due to the concentration gradation can be exerted. However, when the light-emitting material is, for instance, a hole transporting material and a host material is a material that can hardly transport holes, holes proceed by hopping on a light-emitting material and, since the concentration becomes lower proceeding in a cathode direction, are restricted in movement, but electrons of opposite polarity move by hopping on the host material and are not effectively restricted in movement. Accordingly, efficiency deterioration due to electrons passing through the light-emitting element without recombining cannot be inhibited from occurring, and further, expansion of a light emitting region is not sufficient; accordingly, improvement in durability is small.

Until now, means that sufficiently realizes the compatibility of high light-emission efficiency and high durability in a light-emitting element having a concentration gradation in a light-emitting layer has not been known.

SUMMARY OF THE INVENTION

The present invention has been made in view of the above circumstances and provides an organic electroluminescence element with the following aspects.

A first aspect of the invention provides an organic electroluminescence element comprising an organic layer comprising a light-emitting layer between a pair of electrodes, wherein the light-emitting layer contains at least two light-emitting materials having different Ea (electron affinity) values and at least one host material, a concentration of a light-emitting material having a larger Ea value among the at least two light-emitting materials in the light-emitting layer gradually decreases from a cathode side toward an anode side in the light-emitting layer, and a concentration of a light-emitting material having a smaller Ea value among the at least two light-emitting materials in the light-emitting layer gradually decreases from the anode side toward the cathode side.

A second aspect of the invention provides an organic electroluminescence element comprising an organic layer comprising a light-emitting layer between a pair of electrodes, wherein the light-emitting layer contains at least two light-emitting materials having different Ip (ionization potential) values and at least one host material, a concentration of a light-emitting material having a smaller Ip value among the at least two light-emitting materials in the light-emitting layer gradually decreases from an anode side toward a cathode side in the light-emitting layer, and a concentration of a light-emitting material having a larger Ip value among the at least two light-emitting materials in the light-emitting layer gradually decreases from the cathode side toward the anode side.

DETAILED DESCRIPTION OF THE INVENTION

Figure 1:
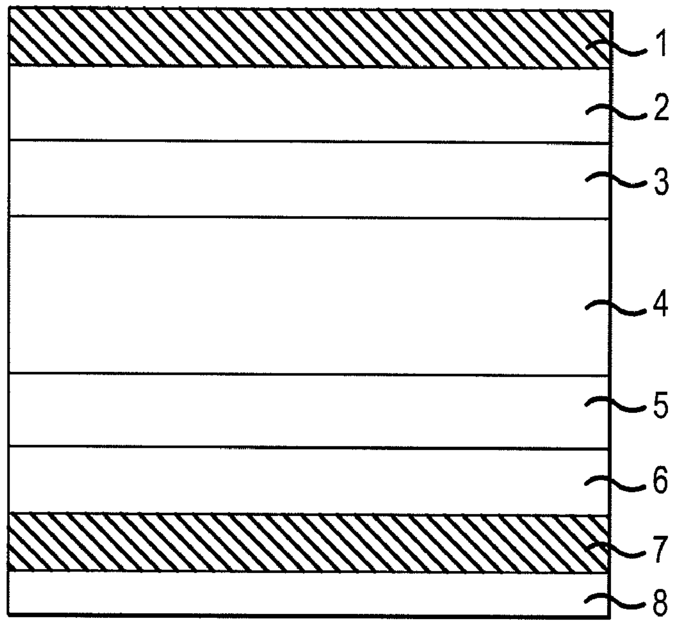
FIG. 1 is an organic electroluminescence element according to one embodiment of the present invention.

An object of the present invention is to provide an organic EL element with high light-emission efficiency and excellent durability.

The problem of the invention described above has been solved by an organic electroluminescence element comprising an organic layer comprising a light-emitting layer between a pair of electrodes, wherein the light-emitting layer contains at least two light-emitting materials having different Ip (ionization potential) values and at least one host material, a concentration of a light-emitting material having a larger Ea value among the at least two light-emitting materials in the light-emitting layer gradually decreases from a cathode side toward an anode side in the light-emitting layer, and a concentration of a light-emitting material having a smaller Ea value among the at least two light-emitting materials in the light-emitting layer gradually decreases from the anode side toward the cathode side.

Another embodiment to solve the problem of the present invention described above is an organic electroluminescence element comprising an organic layer comprising a light-emitting layer between a pair of electrodes, wherein the light-emitting layer contains at least two light-emitting materials having different Ip (ionization potential) values and at least one host material, a concentration of a light-emitting material having a smaller Ip value among the at least two light-emitting materials in the light-emitting layer gradually decreases from an anode side toward a cathode side in the light-emitting layer, and a concentration of a light-emitting material having a larger Ip value among the at least two light-emitting materials in the light-emitting layer gradually decreases from the cathode side toward the anode side.

Preferably, a concentration of the light-emitting material which gradually decreases from the cathode side toward the anode side is from 0% to 50% in an interface region of the light-emitting layer on the anode side with respect to a concentration thereof in an interface region of the light-emitting layer on the cathode side, and also a concentration of the light-emitting material which gradually decreases from the anode side toward the cathode side is from 0% to 50% in the interface region of the light-emitting layer on the cathode side with respect to a concentration thereof in the interface region of the light-emitting layer on the anode side.

Preferably, the light-emitting layer contains at least two host materials having different Ea values, a concentration of the host material having a larger Ea value among the at least two host materials in the light-emitting layer gradually decreases from the cathode side of the light-emitting layer toward the anode side, and a concentration of the host material having a smaller Ea value among the at least two host materials in the light-emitting layer gradually decreases from the anode side toward the cathode side.

Preferably, the light-emitting layer contains at least two host materials having different Ip values, a concentration of the host material having a smaller Ip value among the at least two host materials in the light-emitting layer gradually decreases from the anode side of the light-emitting layer toward the cathode side, and a concentration of the host material having a larger Ip value among the at least two host materials in the light-emitting layer gradually decreases from the cathode side toward the anode side.

Preferably, a concentration of the host material which gradually decreases from the cathode side toward the anode side in the light-emitting layer is from 0% to 50% in an interface region of the light-emitting layer on the anode side with respect to a concentration thereof in an interface region of the light-emitting layer on the cathode side, and also a concentration of the host material which gradually decreases from the anode side toward the cathode side in the light-emitting layer is from 0% to 50% in an interface region of the light-emitting layer on the cathode side with respect to a concentration thereof in the interface region of the light-emitting layer on the anode side.

Preferably, at least one of the at least two light-emitting materials is a phosphorescent light-emitting material.

Preferably, at least one of the at least two light-emitting materials is a metal complex having platinum as a central metal.

Preferably, at least one of the at least two light-emitting materials is a metal complex having iridium as a central metal.

Preferably, the light-emitting material gradually decreasing from the cathode side toward the anode side is a metal complex having platinum as a central metal, and the light-emitting material gradually decreasing from the anode side toward the cathode side is a metal complex having iridium as a central metal.

Preferably, a difference in maximum emission wavelengths between the at least two light-emitting materials is 30 nm or less.

Preferably, an Eg value (energy gap value) expressed by a difference between an Ip value and an Ea value of the host material is larger by 0.5 eV or more than any Eg values of the at least two light-emitting materials.

According to the present invention, there is provided an organic EL element with high light-emission efficiency and excellent durability. In particular, there is provided an organic EL element using a phosphorescent light-emitting material, which is high in light-emission efficiency, free from a reduction in light-emission efficiency even in a high current region and has high light-emission efficiency and excellent drive durability over a wide region from a low current region to a high current region.

The organic electroluminescence element of the present invention is an organic electroluminescence element comprising an organic layer comprising a light-emitting layer disposed between a pair of electrodes, wherein the light-emitting layer contains at least two light-emitting materials having different Ea (electron affinity) values and at least one host material, a concentration of a light-emitting material having a larger Ea value among the at least two light-emitting materials in the light-emitting layer gradually decreases from a cathode side toward an anode side in the light-emitting layer, and a concentration of a light-emitting material having a smaller Ea value among the at least two light-emitting materials in the light-emitting layer gradually decreases from the anode side toward the cathode side. An another embodiment of the invention is an organic electroluminescence element comprising an organic layer comprising a light-emitting layer between a pair of electrodes, wherein the light-emitting layer contains at least two light-emitting materials having different Ip (ionization potential) values and at least one host material, a concentration of a light-emitting material having a smaller Ip value among the at least two light-emitting materials in the light-emitting layer gradually decreases from an anode side toward a cathode side of the light-emitting layer, and a concentration of a light-emitting material having a larger Ip value among the at least two light-emitting materials in the light-emitting layer gradually decreases from the cathode side toward the anode side.

Preferably, the light-emitting layer contains at least two host materials different Ea values, a concentration of the host material having a larger Ea value among the at least two host materials in the light-emitting layer gradually decreases from the cathode side of the light-emitting layer toward the anode side, and a concentration of the host material having a smaller Ea value among the at least two host materials in the light-emitting layer gradually decreases from the anode side toward the cathode side. In another preferable embodiment of the invention, the light-emitting layer contains at least two host materials having different Ip values, a concentration of the host material having a smaller Ip value among the at least two host materials in the light-emitting layer gradually decreases from an anode side of the light-emitting layer toward the cathode side, and a concentration of the host material having a larger Ip value among the at least two host materials in the light-emitting layer gradually decreases from the cathode side toward the anode side.

In the invention, the term "gradually decrease" means that the concentration decreases on the whole. The concentration may change continuously in a linear or curved manner, or may change stepwise or in a wave state. Alternatively, for example, even when a region where the concentration locally increases exists, the case where a generally decreasing concentration gradation is present should be construed to fall within the intended scope of this application.

As to a concentration gradation of a light-emitting material or a host material or both thereof contained in the light-emitting layer, preferably, a concentration of the material having a concentration in the light-emitting layer gradually decreasing from the cathode side toward the anode side is from 0% to 50% in an interface region of the light-emitting layer on the anode side with respect to a concentration thereof in an interface region of the light-emitting layer on the cathode side, and a concentration of the material having a concentration in the light-emitting layer gradually decreasing from the anode side toward the cathode side is from 0% to 50% in the interface region of the light-emitting layer on the cathode side with respect to a concentration thereof in the interface region of the light-emitting layer on the anode side. The above ranges are more preferably from 0% to 30%, and even more preferably from 0% to 20%.

In the specification of this application, the term "interface region of the light-emitting layer on the cathode side" is defined to refer to a region extending to a thickness of 10% of the thickness of the whole of the light-emitting layer from the interface on the cathode side of the light-emitting layer; and the term "interface region of the light-emitting layer on the anode side" is defined to refer to a region extending to a thickness of 10% of the thickness of the whole of the light-emitting layer from the interface on the anode side of the light-emitting layer. Also, the concentration in that region is defined to refer to an average concentration in that region. The concentration of each of the materials in the "interface region of the light-emitting layer on the cathode side (or anode side)" can be measured by a method such as time-of-flight secondary ion mass spectrometry (TOF-SIMS) or etching X-ray photoelectron spectroscopic analysis (XPS/ESCA).

In the case where a concentration of at least one of the light-emitting material and/or host material having a concentration in the light-emitting layer gradually decreasing from the cathode side toward the anode side in the interface region of the light-emitting layer on the anode side exceeds 50% with respect to a concentration thereof in the interface region of the light-emitting layer on the cathode side, inhibition of passing through of electrons is insufficient, and thereby, the light-emission efficiency is not improved, which is not preferred. Similarly, in the case where a concentration of the material having a concentration in the light-emitting layer gradually decreasing from the anode side toward the cathode side in the interface region of the light-emitting layer on the cathode side exceeds 50% with respect to a concentration in the interface region of the light-emitting layer on the anode side, inhibition of passing through of holes is insufficient, and thereby, the light-emission efficiency is not improved, which is not preferred.

In the present invention, two light-emitting materials that are different in charge transportability are provided with concentration gradations respectively; accordingly, both charges injected in the light-emitting layer are not only restricted from leaking out from the light-emitting layer to prevent leakage of charge and thereby improve the light-emission efficiency, but also, owing to an expansion of the recombination region to the entire light-emitting layer, a burden per volume is alleviated to result in improvement in durability. By using two light-emitting materials that are different in transportability, it is possible to lower the concentration of the light-emitting material to an arbitrary level. As both charges injected in the light-emitting layer proceed, the movements thereof are retarded, and thereby, an ideal configuration that compensates for the defects of known structures is obtained.

Preferably, a weight ratio of a light-emitting material having a larger Ea value to a light-emitting material having a smaller Ea value, that is, (light-emitting material having larger Ea value)/(light-emitting material having smaller Ea value) in the interface region of the light-emitting layer on the anode side is 0.3 or less, more preferably 0.2 or less, and even more preferably 0.1 or less. On the other hand, the weight ratio thereof (light-emitting material having larger Ea value)/(light-emitting material having smaller Ea value) in the interface region of the light-emitting layer on the cathode side is 3 or more, more preferably 5 or more, and even more preferably 10 or more.

Preferably, a weight ratio of a light-emitting material having a larger Ip value and a light-emitting material having a smaller Ip value, that is, (light-emitting material having larger Ip value)/(light-emitting material having smaller Ip value) in the interface region of the light-emitting layer on the anode side is 0.3 or less, more preferably 0.2 or less, and even more preferably 0.1 or less. On the other hand, the weight ratio thereof (light-emitting material having larger Ip value)/(light-emitting material having smaller Ip value) in the interface region of the light-emitting layer on the cathode side is 3 or more, more preferably 5 or more, and even more preferably 10 or more.

A concentration of the light-emitting material and/or host material having a concentration in the light-emitting layer gradually decreasing from the cathode side toward the anode side is preferably from 0% by weight to 30% by weight in the interface region of the light-emitting layer on the anode side, and more preferably from 0% by weight to 10% by weight. Furthermore, a concentration of the light-emitting material and/or host material having a concentration in the light-emitting layer gradually decreasing from the anode side toward the cathode side is preferably from 0% by weight to 30% by weight in the interface region of the light-emitting layer on the cathode side, and more preferably from 0% by weight to 10% by weight.

1. Constitution of Organic EL Element

<Organic EL Element>

The organic EL element of the present invention, for example, may adopt the following layer configurations. However, the present invention is not limited to these configurations, but also may select any configurations dependent to the object thereof or the like.

Anode/light-emitting layer/cathode,

Anode/hole transport layer/light-emitting layer/electron transport layer/cathode, Anode/hole transport layer/light-emitting layer/blocking layer/electron transport layer/cathode, Anode/hole transport layer/light-emitting layer/blocking layer/electron transport layer/electron injection layer/cathode, Anode/hole injection layer/hole transport layer/light-emitting layer/blocking layer/electron transport layer/cathode, and Anode/hole injection layer/hole transport layer/light-emitting layer/blocking layer/electron transport layer/electron injection layer/cathode.

The organic EL element in the invention may have a resonator structure. For example, on a transparent substrate, a multi-layered film mirror comprising a plurality of stacked films of different reflective indexes, a transparent or semi-transparent electrode, a light-emitting layer, and a metal electrode stacked to each other are provided. The light generated in the light-emitting layer repeats reflection and conducts oscillation between the multi-layered film mirror and the metal electrode as reflection plates.

In another preferred embodiment of the resonator structure, a transparent or semi-transparent electrode and a metal electrode function respectively as reflection plates on a transparent substrate in which light generated in the light-emitting layer repeats reflection and conducts oscillation therebetween.

For forming the resonance structure, an optical channel length determined based on the effective refractive index of two reflection plates, and the refractive index and the thickness of each of the layers between the reflection plates are controlled to optimal values for obtaining a desired resonance wavelength. A calculation formula in the case of the first embodiment is described in the specification of JP-A No. 9-180883 and the calculation formula in the case of the second embodiment is described in the specification of JP-A No. 2004-127795.

The respective layers constituting the organic compound layer can be suitably formed in accordance with any of a dry film-forming method such as a vapor deposition method, or a sputtering method; a transfer method; a printing method; a coating method; an ink-jet method; or a spray method.

Hereinafter, the constituent components of the organic EL element of the invention are described in detail.

2. Light-Emitting Layer

The light-emitting layer is a layer having a function for receiving holes from the anode, the hole-injection layer, the hole-transport layer or the hole transporting intermediate layer, and receiving electrons from the cathode, the electron injection layer, the electron transport layer, or the electron transporting intermediate layer, and for providing a field for recombination of the holes with the electrons to emit light when an electric filed is applied thereto.

The light-emitting layer in the present invention contains at least two light-emitting materials different in an Ea value (electron affinity) and at least one host material, a concentration of a light-emitting material having a larger Ea value among the at least two light-emitting materials in the light-emitting layer gradually decreases from a cathode side toward an anode side in the light-emitting layer, and a concentration of a light-emitting material having a smaller Ea value among the at least two light-emitting materials in the light-emitting layer gradually decreases from the anode side toward the cathode side.

A first light-emitting material preferably has an Ea value of from 2.5 eV to 3.5 eV, and a second light-emitting material preferably has an Ea value of from 2.0 eV to 3.0 eV, wherein a difference in the Ea value of the at least two light-emitting materials is preferably from 0.1 eV to 1.0 eV.

More preferably, the Ea value of the first light-emitting material is from 2.7 eV to 3.3 eV, and even more preferably from 2.8 eV to 3.2 eV.

More preferably, the Ea value of the second light-emitting material is from 2.4 eV to 3.0 eV, and even more preferably from 2.5 eV to 2.9 eV.

More preferably, the difference in an Ea value of the at least two light-emitting materials is from 0.1 eV to 0.7 eV, and even more preferably from 0.2 eV to 0.5 eV.

An another embodiment of the light-emitting layer in the present invention contains at least two light-emitting materials different in an Ip value (ionization potential) and at least one host material, a concentration of a light-emitting material having a smaller Ip value among the at least two light-emitting materials in the light-emitting layer gradually decreases from an anode side toward a cathode side of the light-emitting layer, and a concentration of a light-emitting material having a larger Ip value among the at least two light-emitting materials in the light-emitting layer gradually decreases from the cathode side toward the anode side.

A first light-emitting material preferably has an Ip value of from 5.0 eV to 6.0 eV, and a second light-emitting material has an Ip value of from 5.5 eV to 6.5 eV, wherein a difference in the Ip value of the at least two light-emitting materials is preferably from 0.1 eV to 1.0 eV.

More preferably, the Ip value of the first light-emitting material is from 5.2 eV to 5.9 eV, and even more preferably from 5.4 eV to 5.8 eV.

More preferably, the Ip value of the second light-emitting material is from 5.6 eV to 6.3 eV, and even more preferably from 5.7 eV to 6.1 eV.

More preferably, the difference in an Ip value of the at least two light-emitting materials is from 0.1 eV to 0.7 eV, and more preferably from 0.2 eV to 0.5 eV.

Preferably, at least two host materials different in an Ea value or Ip value are contained in the light-emitting layer, a concentration of the host material having a larger Ea value or Ip value in the light-emitting layer gradually decreases from the cathode side of the light-emitting layer toward the anode side, and a concentration of the host material having a smaller Ea value or Ip value in the light-emitting layer gradually decreases from the anode side toward the cathode side.

A first host material preferably has an Ea value of from 2.5 eV to 3.5 eV, and a second host material preferably has an Ea value of from 2.0 eV to 3.0 eV, wherein a difference in the Ea value of the at least two host materials is preferably from 0.1 eV to 1.0 eV.

More preferably, the Ea value of the first host material is from 2.7 eV to 3.3 eV, and even more preferably from 2.7 eV to 3.2 eV.

More preferably, the Ea value of the second host material is from 2.4 eV to 3.0 eV, and even more preferably from 2.5 eV to 2.9 eV.

A first host material preferably has an Ip value of from 5.0 eV to 6.0 eV, and a second host material preferably has an Ip value of from 5.5 eV to 6.5 eV, wherein a difference in the Ip value of the at least two host materials is preferably from 0.1 eV to 1.0 eV.

More preferably, the Ip value of the first host material is from 5.2 eV to 5.9 eV, and even more preferably from 5.4 eV to 5.7 eV.

More preferably, the Ip value of the second host material is from 5.6 eV to 6.3 eV, and even more preferably from 5.7 eV to 6.2 eV.

More preferably, a difference in an Ea value of the at least two host materials is from 0.1 eV to 0.7 eV, and even more preferably from 0.2 eV to 0.5 eV.

More preferably, the difference in an Ip value of the at least two host materials is from 0.1 eV to 0.7 eV, and even more preferably from 0.2 eV to 0.5 eV.

Preferably, an Eg value (energy gap value) expressed by a difference between an Ip value and an Ea value of the host material is larger by 0.5 eV or more than any Eg values of the at least two light-emitting materials.

Preferably, a difference in maximum emission wavelengths between the at least two light-emitting materials is 30 nm or less.

A total amount of the light-emitting materials in the light-emitting layer is preferably from 0.1% by weight to 30% by weight with respect to the entire amount of compounds contained in the light-emitting layer, and more preferably from 1% by weight to 20% by weight in view of durability and external quantum efficiency. A total amount of the host materials in the light-emitting layer is preferably from 70% by weight to 99.9% by weight, and more preferably from 80% by weight to 99% by weight in view of durability and external quantum efficiency.

The light-emitting materials and host material contained in the light-emitting layer in the present invention may be a combination of a fluorescent light-emitting material which emits light (fluorescence) through a singlet exciton and a host material, or a combination of a phosphorescent light-emitting material which emits light (phosphorescence) through a triplet exciton and a host material, and preferably, a combination of a phosphorescent light-emitting material and a host material is preferred.

(Light-Emitting Material)

Light-emitting materials different in Ea value or Ip value in the present invention may be applied by selecting and combining ones having an appropriate Ea value or Ip value from light-emitting materials described below.

The Ip value (ionization potential) is defined as energy necessary for extracting one electron from an atom or a molecule. The Ea value (electron affinity) is defined as energy liberated when an electron is added to an atom or a molecule. The Ip value of an organic deposition layer can be measured in air by use of a photoelectron spectrometer AC-2 (trade name, produced by Riken Keiki Co., Ltd.). The Ea value is determined by obtaining an energy gap value of the deposition layer from an absorption spectrum edge, followed by subtracting the Ip value from an Eg value.

(a) Phosphorescent Light-Emitting Material

Examples of the above-described phosphorescent light-emitting material generally include complexes containing a transition metal atom or a lanthanoid atom.

For instance, although the transition metal atom is not limited, it is preferably ruthenium, rhodium, palladium, tungsten, rhenium, osmium, iridium, or platinum; more preferably rhenium, iridium or platinum, and even more preferably iridium or platinum.

Specific examples of the lanthanoid atom include lanthanum, cerium, praseodymium, neodymium, samarium, europium, gadolinium, terbium, dysprosium, holmium, erbium, thulium, ytterbium, and lutetium, and among these lanthanoid atoms, neodymium, europium, and gadolinium are preferred.

Examples of ligands in the complex include the ligands described, for example, in "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "YUHKI KINZOKU KAGAKU—KISO TO OUYOU—(Organometallic Chemistry—Fundamental and Application—)" authored by Akio Yamamoto, published by Shokabo Publishing Co., Ltd. in 1982.

Specific examples of the ligands preferably include halogen ligands (preferably chlorine ligands), aromatic carbocyclic ligands (e.g., cyclopentadienyl anions, benzene anions, naphthyl anions and the like), nitrogen-containing heterocyclic ligands (e.g., phenylpyridine, benzoquinoline, quinolinol, bipyridyl, phenanthroline and the like), diketone ligands (e.g., acetylacetone and the like), carboxylic acid ligands (e.g., acetic acid ligands and the like), alcoholato ligands (e.g., phenolato ligands and the like), carbon monoxide ligands, isonitryl ligands, and cyano ligand, and more preferably nitrogen-containing heterocyclic ligands.

The above-described complexes may be either a complex containing one transition metal atom in the compound, or a so-called polynuclear complex containing two or more transition metal atoms wherein different metal atoms may be contained at the same time.

Among these, specific examples of the light-emitting material include phosphorescent light-emitting compounds described in patent documents such as U.S. Pat. No. 6,303,238B1, U.S. Pat. No. 6,097,147, International Patent Publication (WO) No. 00157676, WO No. 00/70655, WO No. 01/08230, WO No. 01/39234A2, WO No. 01/41512A1, WO No. 02/02714A2, WO No. 02/15645A1, WO No. and 02/44189A1, JP-A No. 2001-247859, Japanese Patent Application No. 2000-33561, JP-A Nos. 2002-117978, 2002-225352, and 2002-235076, Japanese Patent Application No. 2001-239281, JP-A No. 2002-170684, European Patent (EP) No. 1211257, JP-A Nos. 2002-226495, 2002-234894, 2001-247859, 2001-298470, 2002-173674, 2002-203678, 2002-203679, 2004-357791, and 2006-256999, Japanese Patent Application No. 2005-75341, etc.

(b) Fluorescent Light-Emitting Material

Examples of the fluorescent light-emitting material generally include benzoxazole, benzoimidazole, benzthiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidene compounds, condensed polycyclicaromatic compounds (anthracene, phenanthroline, pyrene, perylene, rubrene, pentacene and the like), a variety of metal complexes represented by metal complexes of 8-quinolinol, pyromethene complexes or rare-earth complexes, polymer compounds such as polythiophene, polyphenylene or polyphenylenevinylene, organic silanes, and derivatives thereof.

Among these, specific examples of the light-emitting material include the following compounds, but it should be noted that the present invention is not limited thereto.

D-1

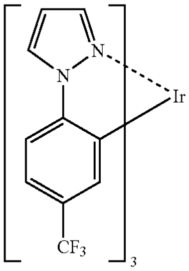

D-2

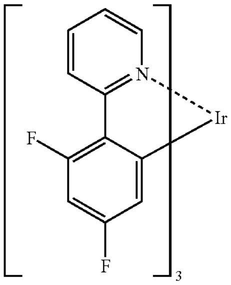

D-3

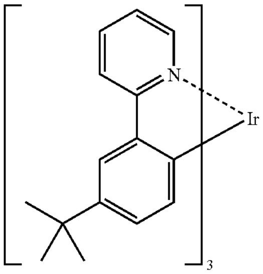

-continued

D-4

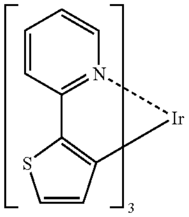

D-5

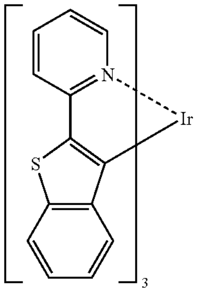

D-6

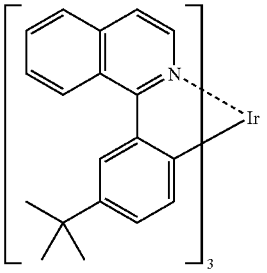

D-7

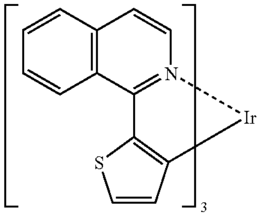

D-8

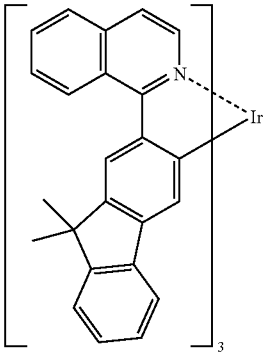

-continued
D-9
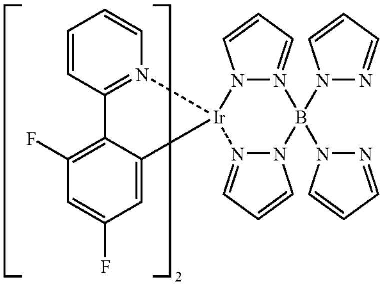
D-10
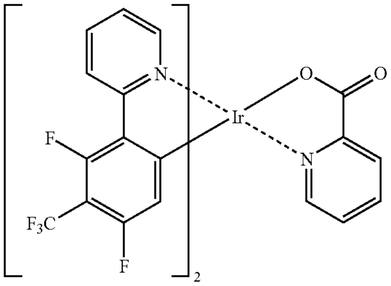
D-11
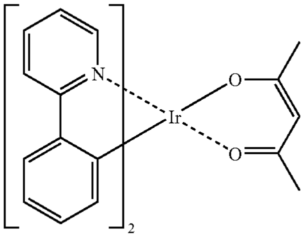
D-12
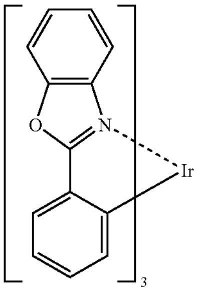
D-13
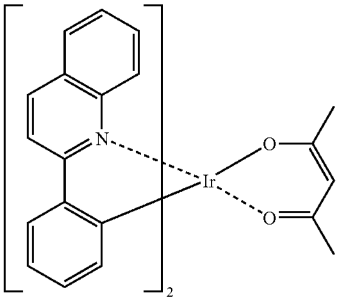
-continued
D-14
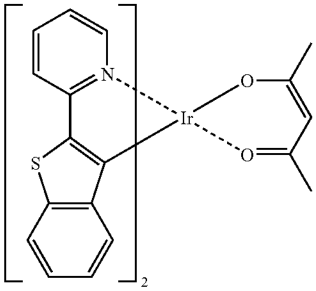
D-15
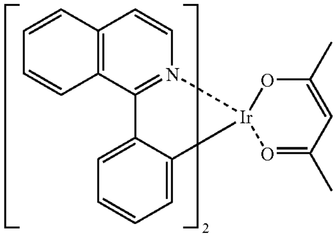
D-16
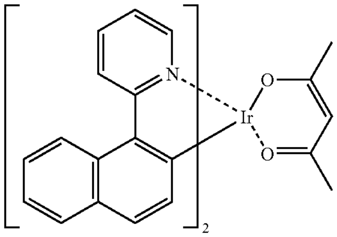
D-17
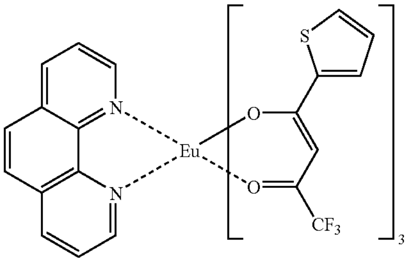
D-18
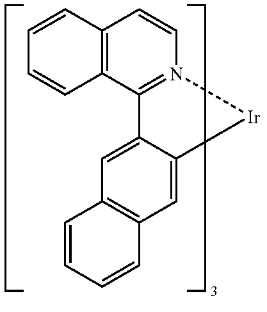
D-19
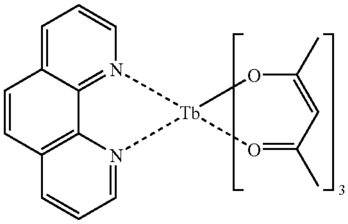

-continued
D-20
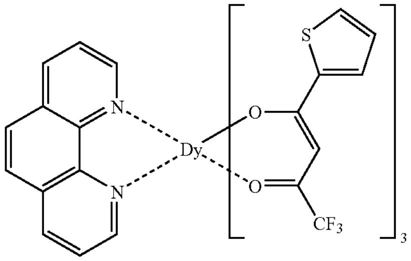
D-21
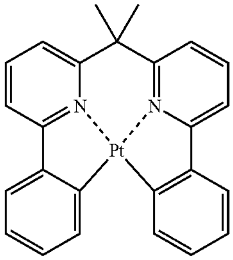
D-22
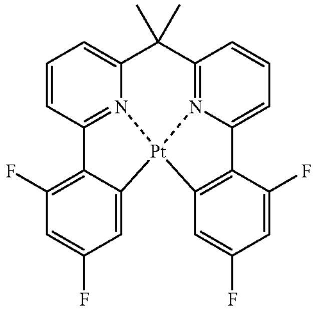
D-23
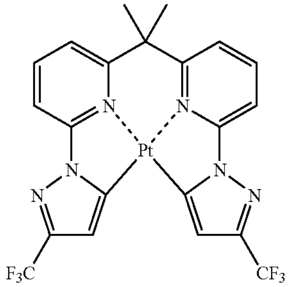
D-24
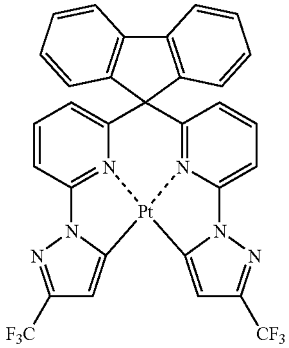
-continued
D-25
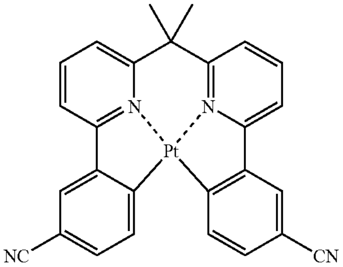
D-26
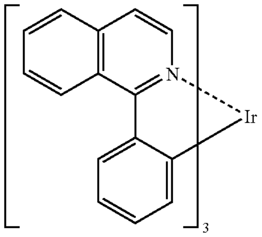
D-27
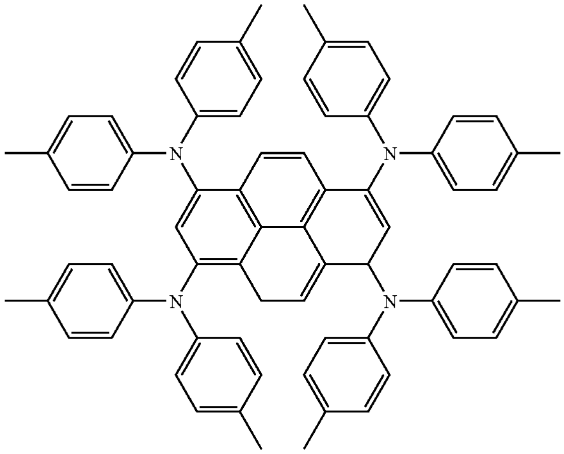
D-28
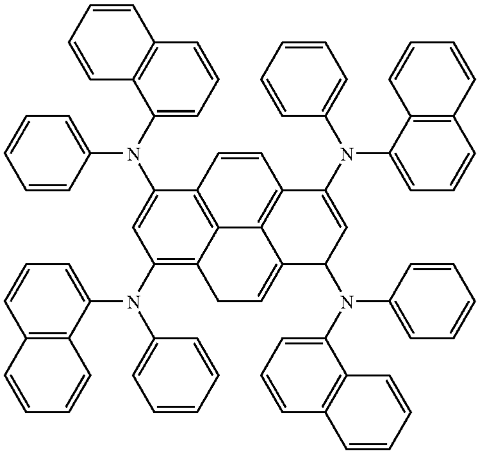

-continued

D-29

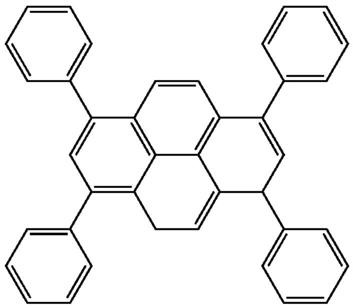

D-30

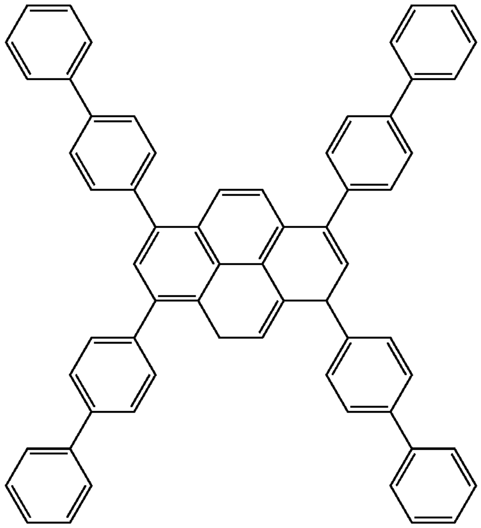

Among the above-described compounds, as the light-emitting material to be used in the present invention, D-2, D-3, D-4, D-5, D-6, D-7, D-8, D-9, D-10, D-11, D-12, D-13, D-14, D-15, D-16, D-21, D-22, D-23, D-24, D-25, D-26, or D-27 to D-30 is preferable, D-2, D-3, D-4, D-5, D-6, D-7, D-8, D-12, D-14, D-15, D-16, D-21, D-22, D-23, D-24, D-25, D-26, or D-27 to D-30 is more preferable, and D-23, D-24, D-25, D-26, or D-27 to D-30 is even more preferable in view of external quantum efficiency and durability.

(Host Material)

As a host material used in the invention, a hole transporting host material (in some cases, referred to as a hole transporting host) excellent in hole transportability and an electron transporting host material (in some cases, referred to as an electron transporting host) excellent in electron transportability may be used.

Host materials different in an Ea value or Ip value in the present invention may be applied by selecting and combining ones having an appropriate Ea value or Ip value from host materials described below.

<<Hole Transporting Host Material>>

The hole transporting host material used for the organic layer of the present invention preferably has an ionization potential Ip of from 5.1 eV to 6.4 eV, more preferably from 5.4 eV to 6.2 eV, and even more preferably from 5.6 eV to 6.0 eV in view of improvements in durability and decrease in driving voltage. Furthermore, in the case where the hole transporting host shows electron transportability, an electron restriction effect by the concentration gradation is deteriorated, that is not preferred. Accordingly, it preferably has an electron affinity Ea of from 1.2 eV to 3.0 eV, more preferably from 1.4 eV to 2.8 eV, and even more preferably from 1.8 eV to 2.6 eV.

Specific examples of the hole transporting hosts as mentioned above include pyrrole, carbazole, azacarbazole, pyrazole, indole, azaindole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electric conductive high-molecular oligomers such as thiophene oligomers, polythiophenes and the like, organic silanes, carbon films, derivatives thereof, and the like.

Among these, carbazole derivatives, indole derivatives, imidazole derivatives, aromatic tertiary amine compounds, and thiophene derivatives are preferable, and particularly, compounds containing a plurality of carbazole skeletons and/or indole skeletons and/or aromatic tertiary amine skeletons in the molecule are preferred.

As specific examples of the hole transporting host material described above, the following compounds are listed, but the present invention is not limited thereto.

H-1

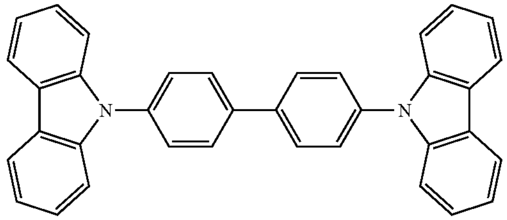

H-2

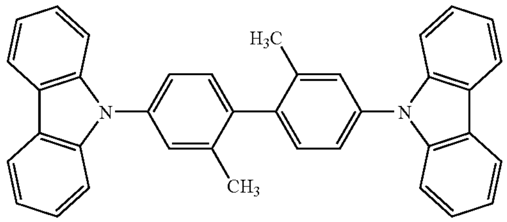

H-3

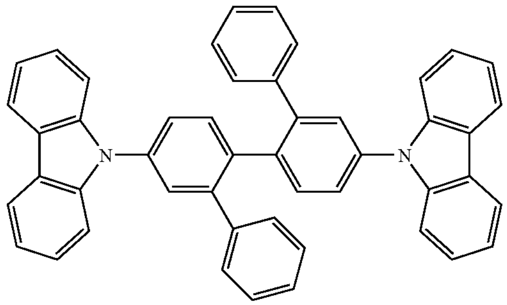

-continued
H-4
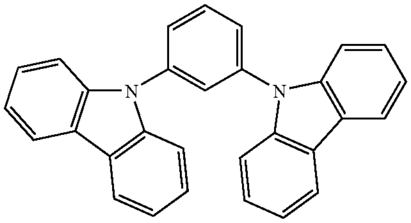
H-5
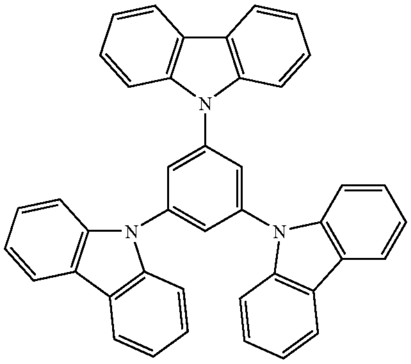
H-6
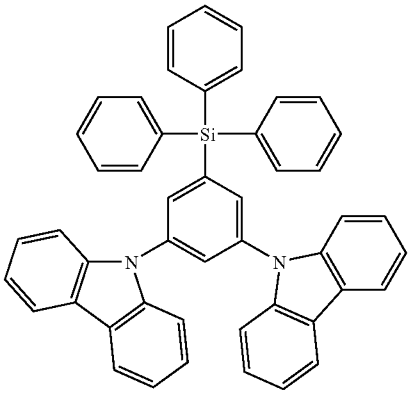
H-7
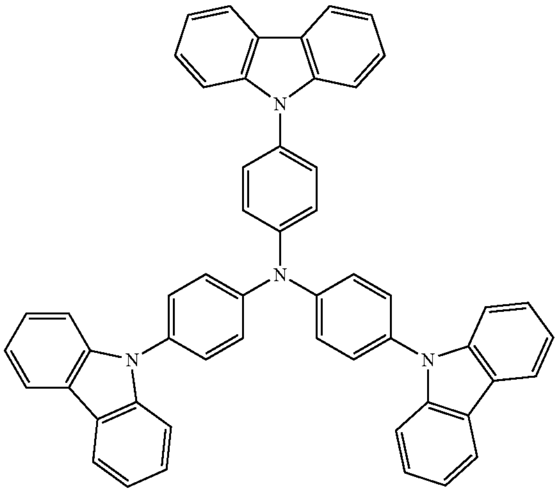
-continued
H-8
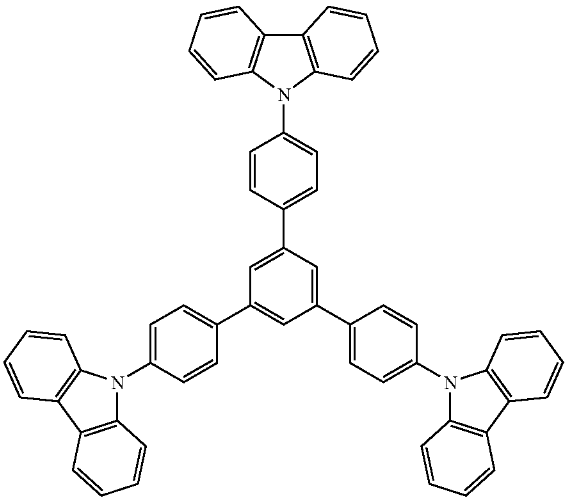
H-9
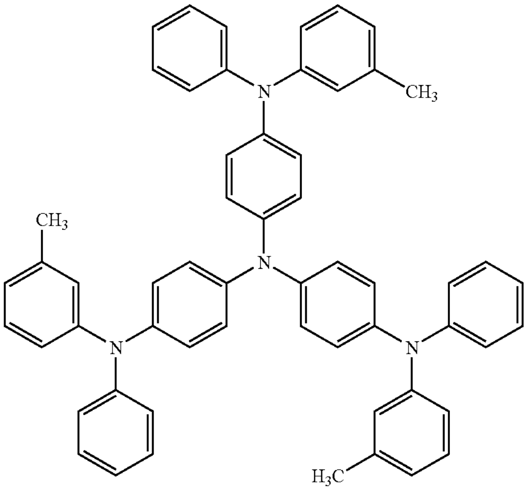
H-10
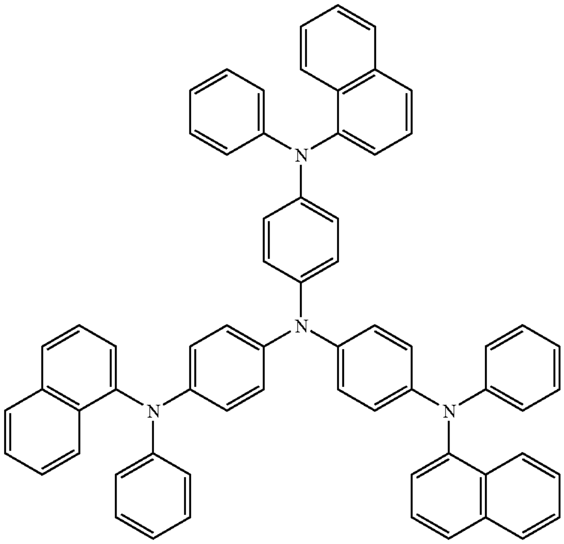

-continued
H-11
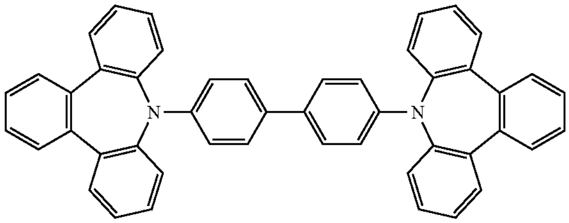
H-12
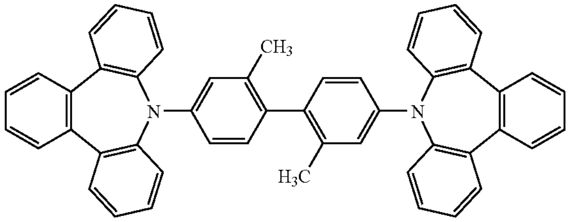
H-13
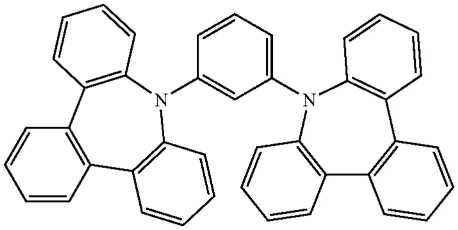
H-14
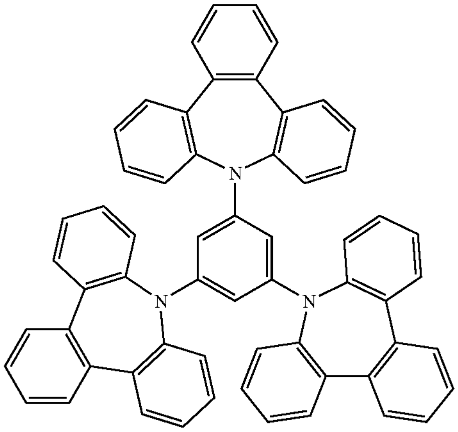
-continued
H-15
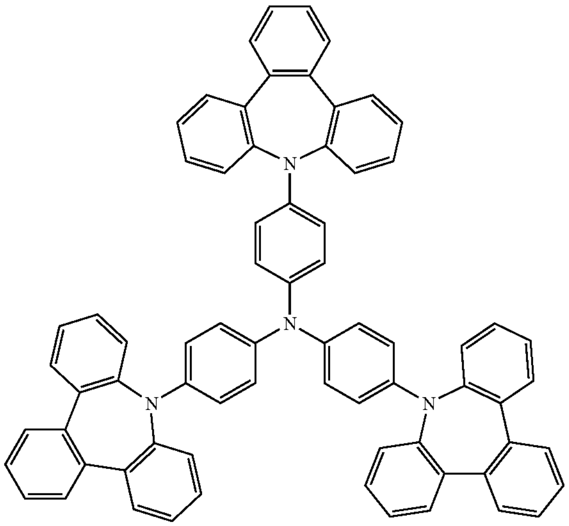
H-16
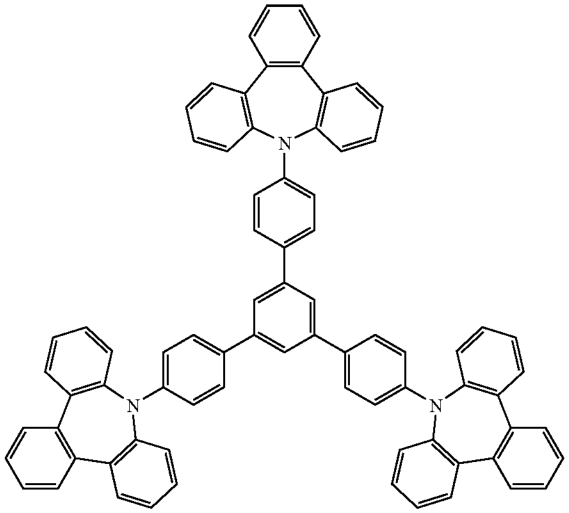
H-17
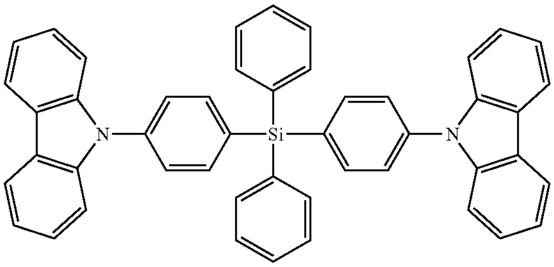

-continued
H-18
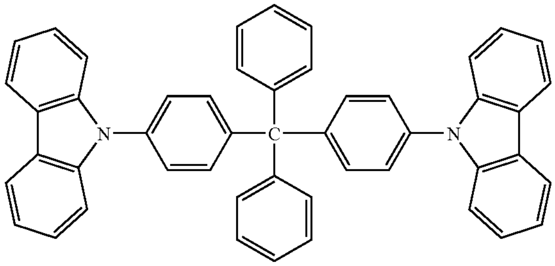
H-19
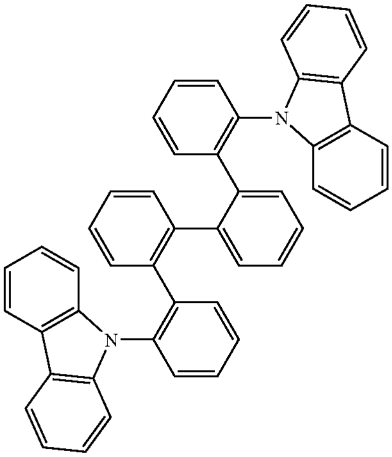
H-20
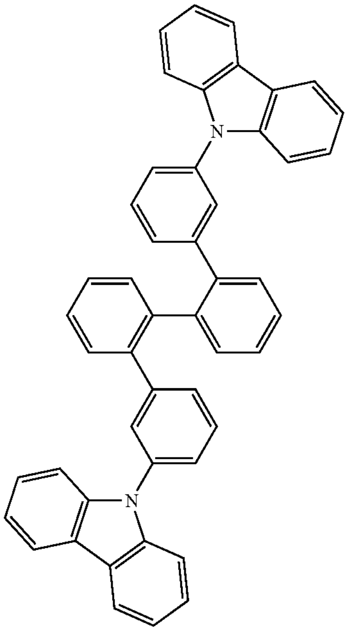
-continued
H-21
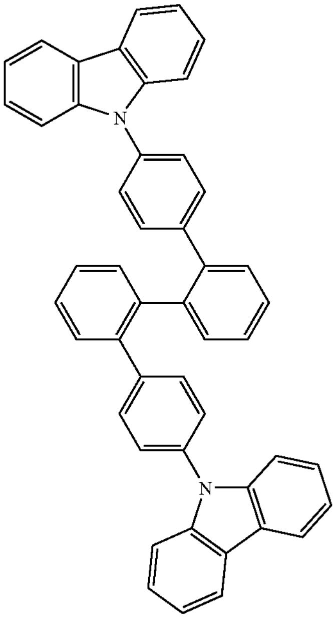
H-22
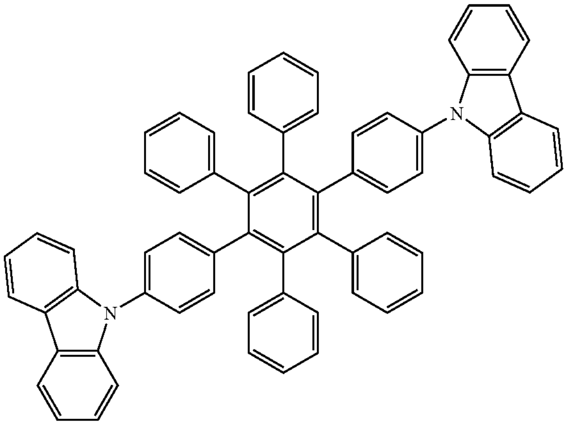
H-23
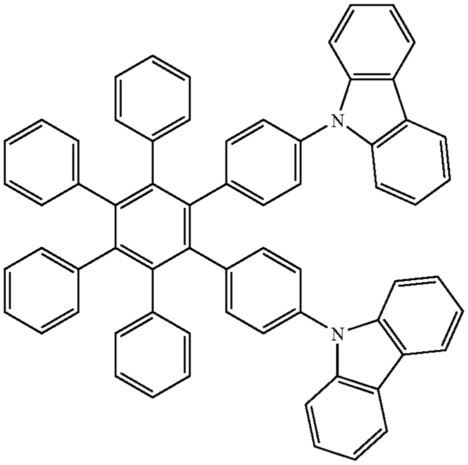

-continued

H-24

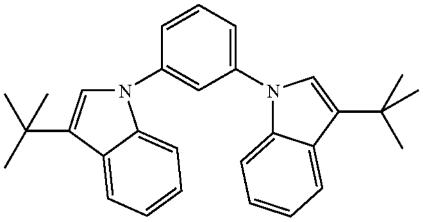

<<Electron Transporting Host>>

As the electron transporting host used in the present invention, it is preferred that an electron affinity Ea of the electron transporting host is from 2.5 eV to 3.5 eV, more preferably from 2.6 eV to 3.4 eV, and even more preferably from 2.8 eV to 3.3 eV in view of improvements in durability and decrease in driving voltage. Furthermore, in the case where the electron transporting host shows hole transportability, a charge restriction effect by the concentration gradation is deteriorated, that is not preferred. Accordingly, it is preferred that an ionization potential Ip of the host is from 6.0 eV to 7.5 eV, more preferably from 6.2 eV to 7.0 eV, and even more preferably from 6.3 eV to 6.8 eV.

Specific examples of the electron transporting hosts as mentioned above include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyrazine, fluorine-substituted aromatic compounds, aromacyclic tetracarboxylic anhydrides of naphthalene, perylene or the like, phthalocyanine, derivatives thereof (which may form a condensed ring with another ring), and a variety of metal complexes represented by metal complexes of 8-quinolinol derivatives, metal phthalocyanine, and metal complexes having benzoxazole or benzothiazole as the ligand.

Preferable electron transporting hosts are metal complexes, azole derivatives (benzimidazole derivatives, imidazopyridine derivatives and the like), and azine derivatives (pyridine derivatives, pyrimidine derivatives, triazine derivatives and the like).

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and even more preferable is an aluminum ion, a zinc ion, or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU—(OrganoMetallic Chemistry—Fundamental and Application—)" authored by Akio Yamamoto, published by Shokabo Publishing Co., Ltd. in 1982, and the like.

Examples of the metal complex electron transporting host material include compounds described, for example, in JP-A Nos. 2002-235076, 2004-214179, 2004-221062, 2004-221065, 2004-221068, 2004-327313 and the like.

Specific examples of the electron transporting host material include the following materials, but it should be noted that the present invention is not limited thereto.

E-1

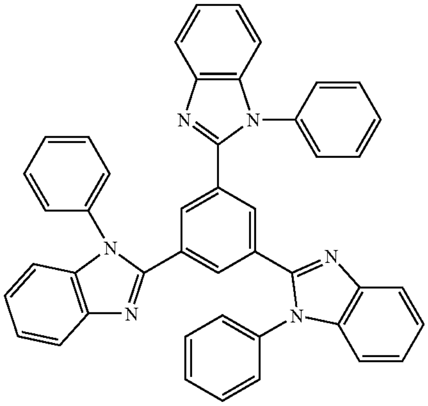

E-2

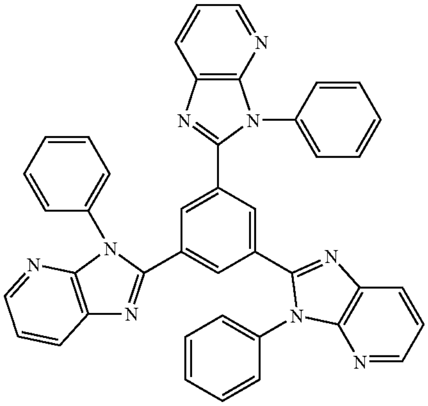

E-3

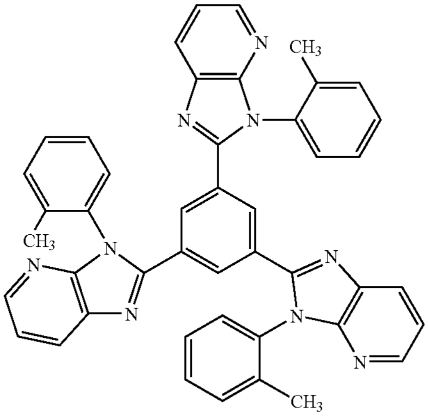

-continued
E-4
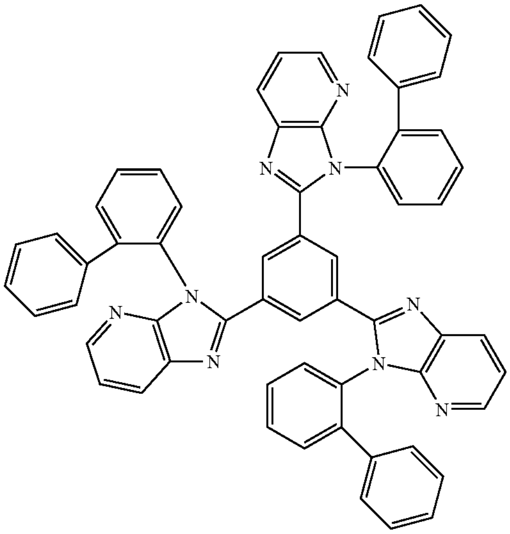
E-5
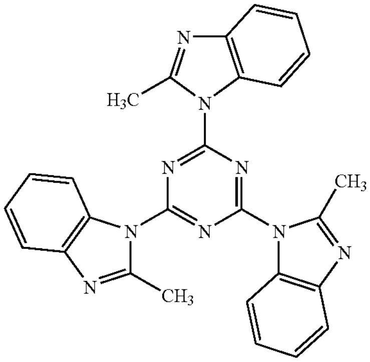
E-6
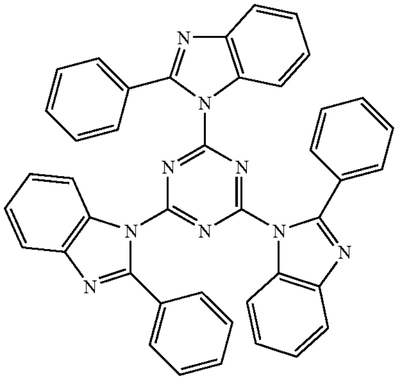
E-7
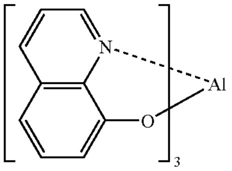
-continued
E-8
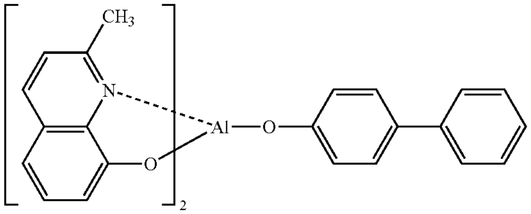
E-9
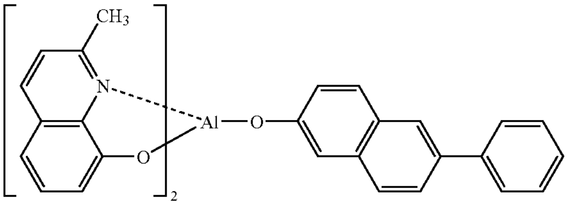
E-10
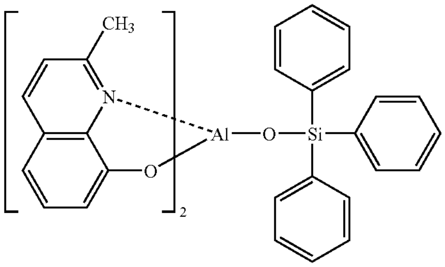
E-11
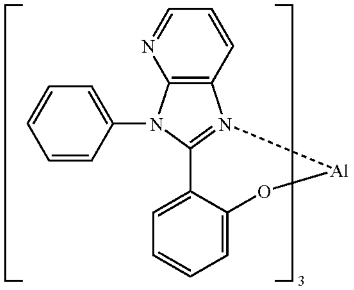
E-12
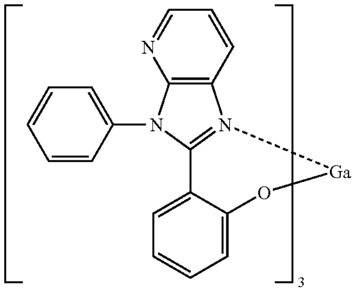

-continued

E-13

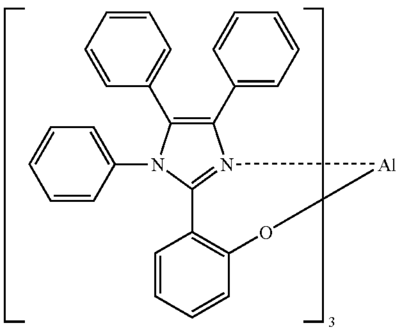

E-14

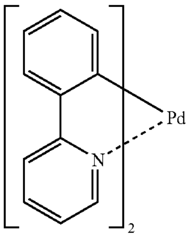

E-15

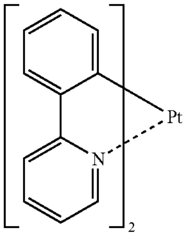

E-16

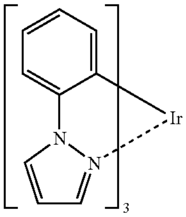

E-17

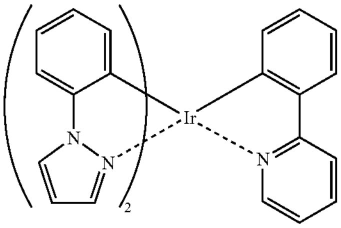

E-18

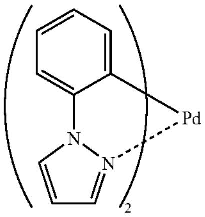

-continued

E-19

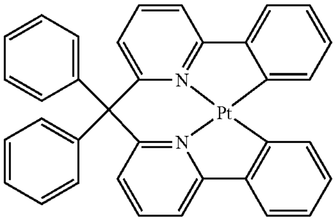

E-20

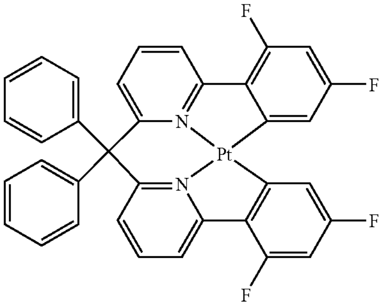

E-21

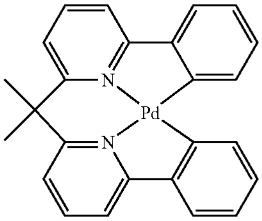

E-22

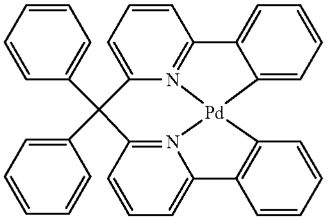

As the electron transporting host, E-1 to E-6, E-8, E-9, E-10, E-21, or E-22 is preferred, E-3, E-4, E-6, E-8, E-9, E-10, E-21, or E-22 is more preferred, and E-3, E-4, E-8, E-9, E-21, or E-22 is even more preferred.

<Film Thickness>

The film thickness of the light-emitting layer is preferably from 10 nm to 500 nm, and more preferably from 20 nm to 100 nm from view points of brightness uniformity, driving voltage and brightness. In the case where the thickness of the light-emitting layer is too thin, a passage of charges from the light-emitting layer to adjacent layers increases to result in lowering of the light-emission efficiency. In the case where the thickness of the light-emitting layer is too thick, the driving voltage increases to result in lowering of the light-emission efficiency, that causes restriction for the application.

<Layer Configuration>

The light-emitting layer may be composed of a single layer or two or more layers, and the respective layers may cause light emission in different light-emitting colors. Also, in the case where the light-emitting layer has a laminate structure, though the film thickness of each of the layers configuring the laminate structure is not particularly limited, it is preferable that a total film thickness of each of the light-emitting layers falls within the foregoing range.

3. Hole Injection Layer and Hole Transport Layer

The hole injection layer and hole transport layer are layers functioning to receive holes from an anode or from an anode side and to transport the holes to a cathode side. Materials to be introduced into a hole injection layer or a hole transport layer is not particularly limited, but either of a low molecular compound or a high molecular compound may be used.

Specific examples of the material contained in the hole injection layer and the hole transport layer include preferably pyrrole derivatives, carbazole derivatives, azacarbazole derivatives, indole derivatives, azaindole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, organosilane derivatives, carbon, and the like.

An electron-accepting dopant may be introduced into the hole injection layer or the hole transport layer in the organic EL element of the present invention. As the electron-accepting dopant to be introduced into the hole injection layer or the hole transport layer, either of an inorganic compound or an organic compound may be used as long as the compound has electron accepting property and a function for oxidizing an organic compound.

Specifically, the inorganic compound includes metal halides such as ferric chloride, aluminum chloride, gallium chloride, indium chloride, antimony pentachloride and the like, and metal oxides such as vanadium pentaoxide, molybdenum trioxide and the like.

In case of employing the organic compounds, compounds having a substituent such as a nitro group, a halogen, a cyano group, a trifluoromethyl group or the like; quinone compounds; acid anhydride compounds; fullerenes; and the like may be preferably applied.

Specific examples thereof other than those above include compounds described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

Specific examples of the organic compounds preferably include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine and fullerene C60. Among these, hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone and 2,3,5,6-tetracyanopyridine are more preferable, and tetrafluorotetracyanoquinodimethane is particularly preferred.

These electron-accepting dopants may be used alone or in a combination of two or more of them.

Although an applied amount of these electron-accepting dopants depends on the type of material, 0.01% by weight to 50% by weight is preferred with respect to a hole transport layer material, 0.05% by weight to 20% by weight is more preferable, and 0.1% by weight to 10% by weight is particularly preferred.

A thickness of the hole injection layer and a thickness of the hole transport layer are each preferably 500 nm or less in view of decreasing driving voltage.

The thickness of the hole transport layer is preferably from 1 nm to 500 nm, more preferably from 5 nm to 50 nm, and even more preferably from 10 nm to 40 nm. The thickness of the hole injection layer is preferably from 0.1 nm to 500 nm, more preferably from 0.5 nm to 300 nm, and even more preferably from 1 nm to 200 nm.

The hole injection layer and the hole transport layer may be composed of a monolayer structure comprising one or two or more of the above-mentioned materials, or a multilayer structure composed of plural layers of a homogeneous composition or a heterogeneous composition.

4. Electron Injection Layer and Electron Transport Layer

The electron injection layer and the electron transport layer are layers having functions for receiving electrons from a cathode or a cathode side, and transporting electrons to an anode side. An electron injection material or an electron transporting material used for these layers may be a low molecular compound or a high molecular compound.

Specific examples of the materials applied for the electron injection layer and the electron transport layer include pyridine derivatives, quinoline derivatives, pyrimidine derivatives, pyrazine derivatives, phthalazine derivatives, phenanthroline derivatives, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, aromacyclic tetracarboxylic anhydrides of perylene, naphthalene or the like, phthalocyanine derivatives, metal complexes represented by metal complexes of 8-quinolinol derivatives, metal phthalocyanine, and metal complexes containing benzoxazole, or benzothiazole as the ligand, organic silane derivatives exemplified by silole, and the like.

The electron injection layer or the electron transport layer may contain an electron donating dopant. As the electron donating dopant introduced in the electron injection layer or the electron transport layer, any material may be used as long as it has an electron-donating property and a property for reducing an organic compound, and an alkaline metal such as Li, an alkaline earth metal such as Mg) a transition metal including a rare-earth metal, or a reducing organic compound is preferably used. As the metal, particularly, a metal having a work function of 4.2 V or less is preferably applied, and specific examples thereof include Li, Na, K, Be, Mg, Ca, Sr, Ba, Y, Cs, La, Sm, Gd, Yb, and the like. Specific examples of the reducing organic compounds include nitrogen-containing compounds, sulfur-containing compounds, phosphorus-containing compounds, and the like.

In addition, materials described in JP-A Nos. 6-212153, 2000-196140, 2003-68468, 2003-229278 and 2004-342614 may be used.

These electron donating dopants may be used alone or in a combination of two or more of them. An applied amount of the electron donating dopants differs dependent on the types of the materials, but it is preferably from 0.1% by weight to 99% by weight with respect to an electron transport layer material, more preferably from 1.0% by weight to 80% by weight, and particularly preferably from 2.0% by weight to 70% by weight.

A thickness of the electron injection layer and a thickness of the electron transport layer are each preferably 500 nm or less in view of decrease in driving voltage.

The thickness of the electron transport layer is preferably from 1 nm to 500 nm, more preferably from 5 nm to 200 nm, and even more preferably from 10 nm to 100 nm. A thickness of the electron injection layer is preferably from 0.1 nm to 200 nm, more preferably from 0.2 nm to 100 nm, and even more preferably from 0.5 nm to 50 nm.

The electron injection layer and the electron-transport may be composed of a monolayer structure comprising one or two or more of the above-mentioned materials, or a multilayer structure composed of plural layers of a homogeneous composition or a heterogeneous composition.

5. Substrate

The substrate to be applied in the invention is preferably one which does not scatter or attenuate light emitted from the organic compound layer. Specific examples of materials for the substrate include inorganic materials such as zirconia-stabilized yttrium (YSZ) and glass; polyesters such as polyethylene terephthalate, polybutylene phthalate, and polyethylene naphthalate; and organic materials such as polystyrene, polycarbonate, polyethersulfone, polyarylate, polyimide, polycycloolefin, norbornene resin, polychlorotrifluoroethylene, and the like.

For instance, when glass is used as the substrate, non-alkali glass is preferably used with respect to the quality of material in order to decrease ions eluted from the glass. In the case of employing soda-lime glass, it is preferred to use glass on which a barrier coat of silica or the like has been applied. In the case of employing an organic material, it is preferred to use a material excellent in heat resistance, dimensional stability, solvent resistance, electric insulation performance, and workability.

There is no particular limitation as to the shape, the structure, the size or the like of the substrate, but it may be suitably selected according to the application, purposes and the like of the light-emitting element. In general, a plate-like substrate is preferred as the shape of the substrate. A structure of the substrate may be a monolayer structure or a laminate structure. Furthermore, the substrate may be formed from a single member or two or more members.

Although the substrate may be transparent and colorless, or transparent and colored, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

6. Electrode (Anode)

The anode may generally be any material as long as it has a function as an electrode for supplying holes to the organic compound layer, and there is no particular limitation as to the shape, the structure, the size or the like. However, it may be suitably selected from among well-known electrode materials according to the application and purpose of the light-emitting element. As mentioned above, the anode is usually provided as a transparent anode.

Materials for the anode preferably include, for example, metals, alloys, metal oxides, electric conductive compounds, and mixtures thereof. Materials having a work function of 4.0 eV or more are preferable. Specific examples of the anode materials include electric conductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electric conductive metal oxides; inorganic electric conductive materials such as copper iodide and copper sulfide; organic electric conductive materials such as polyaniline, polythiophene, and polypyrrole; and laminates of these inorganic or organic electron-conductive materials with ITO. Among these, the electric conductive metal oxides are preferred, and particularly, ITO is preferable in view of productivity, high electric conductivity, transparency and the like.

The anode may be formed on the substrate in accordance with a method which is appropriately selected from among wet methods such as printing methods, coating methods and the like; physical methods such as vacuum deposition methods, sputtering methods, ion plating methods and the like; and chemical methods such as CVD (chemical vapor deposition) and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence element of the present invention, a position at which the anode is to be formed is not particularly limited, but it may be suitably selected according to the application and purpose of the light-emitting element. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in a range of from 10 nm to 50 μm, and preferably from 50 nm to 20 μm.

A value of electric resistance of the anode is preferably $10^3 \Omega/\square$ or less, and more preferably $10^2 \Omega/\square$ or less. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHINTENKAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming the film at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the light-emitting element.

Materials constituting the cathode include, for example, metals, alloys, metal oxides, electric conductive compounds, and mixtures thereof. Materials having a work function of 4.0 eV or more are preferable. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term “material containing aluminum as a major component” refers to a material constituted by aluminum alone; alloys comprising aluminum and 0.01% by weight to 10% by weight of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, the contents of which are incorporated by reference herein.

A method for forming the cathode is not particularly limited, but it may be formed in accordance with a well-known method. For instance, the cathode may be formed in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted between the cathode and the organic compound layer with a thickness of from 0.1 nm to 5 nm. The dielectric material layer may be considered to be a kind of electron injection layer. The dielectric material layer may be formed in accordance with, for example, a vacuum deposition method, a sputtering method, an ionplating method or the like.

A thickness of the cathode may be suitably selected according to materials for constituting the cathode and is therefore not definitely decided, but it is usually in a range of from 10 nm to 5 μm, and preferably from 50 nm to 1 μm.

Moreover, the cathode may be transparent or opaque. A transparent cathode may be formed by preparing a material for the cathode with a small thickness of from 1 nm to 10 nm, and further laminating a transparent electric conductive material such as ITO or IZO thereon.

7. Protective Layer

A whole body of the organic EL element of the present invention may be protected by a protective layer.

Any materials may be applied in the protective layer as long as the materials have a function to protect a penetration of ingredients such as moisture, oxygen or the like which accelerates deterioration of the element into the element.

Specific examples of materials for the protective layer include metals such as In, Sn, Pb, Au, Cu, Ag, Al, Ti, Ni and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

8. Sealing

The whole organic electroluminescence element of the present invention may be sealed with a sealing cap.

Furthermore, a moisture absorbent or an inert liquid may be used to seal a space defined between the sealing cap and the light-emitting element. Although the moisture absorbent is not particularly limited, specific examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

9. Driving

In the organic electroluminescence element of the present invention, when a DC (AC components may be contained as needed) voltage (usually 2 volts to 15 volts) or DC is applied across the anode and the cathode, luminescence can be obtained.

For the driving method of the organic electroluminescence element of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

10. Applications

An organic EL element of the invention has such wide ranging applications as a mobile phone display, a personal digital assistant (PDA), a computer display, a car information display, a TV monitor, and general illumination.

All publications, patent applications, and technical standards mentioned in this specification are herein incorporated by reference to the same extent as if each individual publication, patent application, or technical standard was specifically and individually indicated to be incorporated by reference.

EXAMPLES

In the following, the organic EL element of the present invention will be explained by examples thereof, but the invention is by no means limited by such examples.

(Measurement of Ip Value, Ea Value, and Eg Value)

First, methods for measuring an Ip value, Ea value, and Eg value of the light-emitting materials and host materials used in Examples, and results of the measurements are described.

Method for measuring Ip value: each of the material for the measurement was deposited at a thickness of 100 nm on a glass substrate by a vacuum deposition method to prepare a thin-film sample. An Ip value of the obtained thin-film sample was measured using a Photoelectron Spectroscope in Air AC-2 (manufactured by Riken Keiki) at a light quantity of 20 nW.

Method for calculating Ea value: each of the material for the measurement was deposited at a thickness of 100 nm on a quartz substrate by a vacuum deposition method to prepare a thin-film sample, and spectral absorption spectrum in a wavelength region of from 180 nm to 700 nm was measured using a spectrophotometer U3310 (manufactured by Hitachi Co., Ltd.). An energy gap value (Eg (eV)) was calculated from the absorption edge on the longest wavelength side. From the obtained Eg value and Ip value, an Ea value was calculated in accordance with the following equation (1).

$$Ea\ (\text{eV}) = Ip\ (\text{eV}) - Eg\ (\text{eV}) \qquad \text{Equation (1)}$$

Results obtained by the measurements are shown in Table 1.

TABLE 1

| | Ip (eV) | Ea (eV) | Eg (eV) |
|---|---|---|---|
| CBP | 5.9 | 2.4 | 3.5 |
| mCP | 6.0 | 2.3 | 3.7 |
| BTPSB | 7.2 | 2.3 | 4.9 |
| $Ir(ppy)_3$ | 5.4 | 2.7 | 2.7 |
| FIrpic | 5.9 | 3.0 | 2.9 |
| Pt-1 | 5.8 | 2.9 | 2.9 |
| Pt-2 | 6.0 | 3.2 | 2.8 |
| ETH-1 | 6.2 | 2.7 | 3.5 |
| HTH-1 | 5.8 | 2.4 | 3.4 |

TABLE 1-continued

| | Ip (eV) | Ea (eV) | Eg (eV) |
|---|---|---|---|

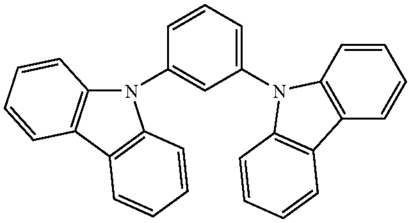

mCP

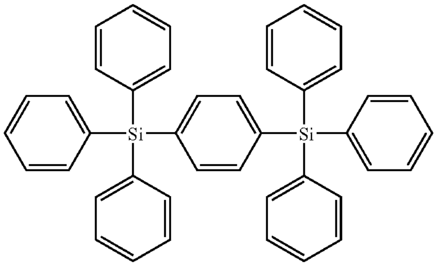

BTPSB

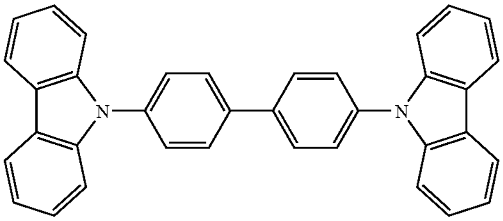

CBP

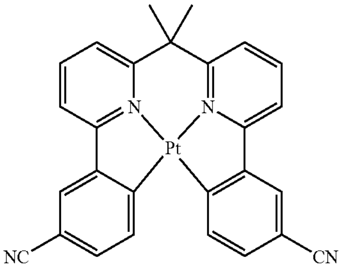

Pt-1

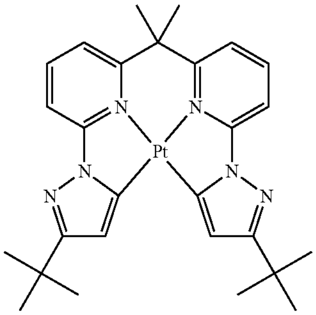

Pt-2

TABLE 1-continued

| | Ip (eV) | Ea (eV) | Eg (eV) |
|---|---|---|---|
| 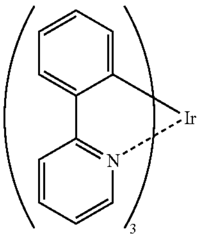 Ir (ppy) 3 | | | |
| 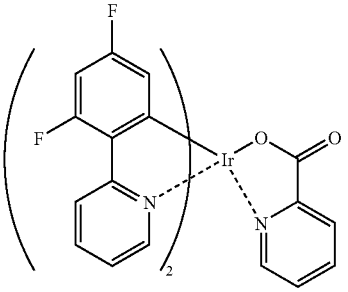 FIrpic | | | |
| 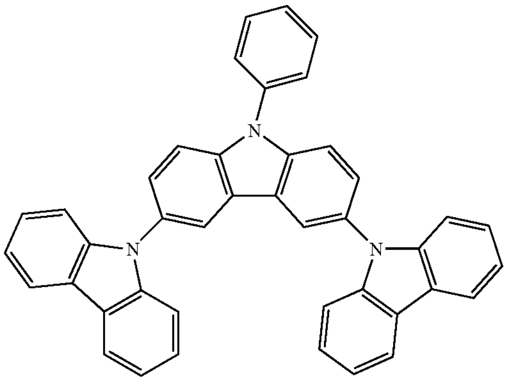 HTH-1 | | | |
| 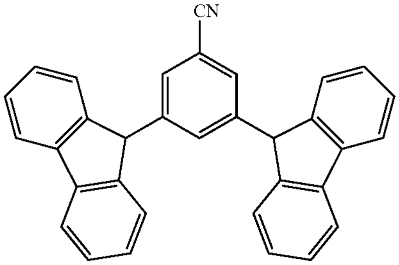 ETH-1 | | | |

Example 1

1. Preparation of Organic EL Element (Preparation of Comparative Organic EL Element No. 1)

A glass substrate (8) with an ITO electrode (7) (manufactured by Geomatec Co., Ltd., electrode surface electric resistance: 10Ω/□, size: 0.5 mm in thickness and 2.5 cm square) having a deposited layer of indium-tin oxide (which is hereinafter referred to as ITO) at a thickness of 100 nm was placed in a cleaning vessel, subjected to an ultrasonic cleaning in 2-propanol and then subjected to an UV-ozone treatment for 30 minutes. On this transparent anode, the following layers were deposited in accordance with a vacuum deposition method. In Examples of the invention, the deposition rate is 0.2 nm/sec unless specified otherwise. The deposition rate was measured using a quartz-crystal oscillator. Also film thicknesses described in the following were measured using a quartz-crystal oscillator.

Hole injection layer (6): 4,4',4"-tris(2-naphthylphenylamino)triphenylamine (which is hereinafter referred to as 2-TNATA), at a thickness of 140 nm.

Hole transport layer (5): N,N'-dinaphthyl-N,N'-diphenyl-[1,1'-biphenyl]-4,4'-diamine (which is hereinafter referred to as α-NPD), at a thickness of 10 nm.

Light-emitting layer (4): 4,4'-di-(N-carbazole)-biphenyl (which is hereinafter referred to as CBP) and iridium (III) fac-tris(2-phenylpyridinato-N, CT) (which is hereinafter referred to as $Ir(ppy)_3$), which is a hole transporting light-emitting material, were co-deposited while changing the co-deposition amount thereof as the deposition was progressing. The deposition rate of each component was controlled so that the mixing ratio of $Ir(ppy)_3$ was 20% by weight at the interface on the anode side at the beginning of the deposition; and the mixing ratio of $Ir(ppy)_3$ was 0% by weight at the interface on the cathode side at the end of the deposition. The mixing ratio of each component was continuously changed between these interfaces. The total thickness of the light-emitting layer was 30 nm. The concentration of each material was as follows: $Ir(ppy)_3$ of 19% by weight, and CBP of 81% by weight in an interface region of the light-emitting layer on the anode side; and $Ir(ppy)_3$ of 1% by weight, and CBP of 99% by weight in an interface region of the light-emitting layer on the cathode side.

Subsequently, on the light-emitting layer, the following electron transport layer and electron injection layer were provided.

Electron transport layer (3): aluminum (III) bis(2-methyl-8-quinolinato) 4-phenylphenolate (which is hereinafter referred to as BAlq), at a thickness of 40 nm.

Electron injection layer (2): lithium fluoride (LiF), at a thickness of 1 nm.

Further, patterning was performed using a shadow mask, and aluminum metal (Al) with a thickness of 100 nm was provided as a cathode (1).

Subsequently, on the light-emitting layer, the following electron transport layer and electron injection layer were provided.

Electron transport layer: aluminum (III) bis(2-methyl-8-quinolinato) 4-phenylphenolate (which is hereinafter referred to as BAlq), at a thickness of 40 nm.

Electron injection layer: lithium fluoride (LiF), at a thickness of 1 nm.

Further, patterning was performed using a shadow mask, and aluminum metal (Al) with a thickness of 100 nm was provided as a cathode.

Each layer was provided by resistance heating vacuum deposition.

The lamination body thus produced was placed in a glove box substituted with nitrogen gas, and was sealed using a stainless-steel sealing cap and an ultraviolet-curable adhesive (XNR5516HV, manufactured by Nagase-Ciba Co., Ltd.).

(Preparation of Comparative Organic EL Element No. 2)

In the comparative organic EL element No. 1, the light-emitting layer was changed to the following layer.

CBP and electron transporting light-emitting material Pt-1 were co-deposited while increasing the co-deposition amount of Pt-1 with respect to CBP as the deposition was progressing.

The deposition rate of each component was controlled so that the mixing ratio of Pt-1 was 0% by weight at the interface on the anode side at the beginning of the deposition; and the mixing ratio of Pt-1 was 20% by weight at the interface on the cathode side at the end of the deposition. The mixing ratio of each component was continuously changed between these interfaces. The total thickness of the light-emitting layer was 30 nm. The concentration of each material was as follows: Pt-1 of 1% by weight, and CBP of 99% by weight in an interface region of the light-emitting layer on the anode side; and Pt-1 of 19% by weight, and CBP of 81% by weight in an interface region of the light-emitting layer on the cathode side.

(Preparation of Inventive Organic EL Element No. 1)

In the comparative organic EL element No. 1, the light-emitting layer was changed to the following layer.

Light-emitting layer: ternary element co-deposition of CBP, the electron transporting light-emitting material Pt-1 and the hole transporting light-emitting material $Ir(ppy)_3$ was conducted while continuously changing the co-deposition amount thereof as the deposition was progressing. The deposition rate of each component was controlled so that the mixing ratio of Pt-1 was 0% by weight and the mixing ratio of $Ir(ppy)_3$ was 20% by weight at the interface on the anode side at the beginning of the deposition; and the mixing ratio of Pt-1 was 20% by weight and the mixing ratio of $Ir(ppy)_3$ was 0% by weight at the interface on the cathode side at the end of the deposition. The mixing ratio of each component was continuously changed between these interfaces. The total thickness of the light-emitting layer was 30 nm. The concentration of each material was as follows: Pt-1 of 1% by weight, $Ir(ppy)_3$ of 19% by weight, and CBP of 80% by weight in an interface region of the light-emitting layer on the anode side; and Pt-1 of 19% by weight, $Ir(ppy)_3$ of 1% by weight, and CBP of 80% by weight in an interface region of the light-emitting layer on the cathode side.

(Preparation of Inventive Organic EL Element No. 2)

In the comparative organic EL element No. 1, the light-emitting layer was changed to the following layer.

Light-emitting layer: ternary element co-deposition of 1,3-bis(carbazol-9-yl)benzene (which is hereinafter referred to as mCP), the electron transporting light-emitting material Pt-1 and the hole transporting light-emitting material $Ir(ppy)_3$ was conducted while continuously changing the co-deposition amount thereof as the deposition was progressing. The deposition rate of each component was controlled so that the mixing ratio of Pt-1 was 0% by weight and the mixing ratio of $Ir(ppy)_3$ was 20% by weight at the interface on the anode side at the beginning of the deposition; and the mixing ratio of Pt-1 was 20% by weight and the mixing ratio of $Ir(ppy)_3$ was 0% by weight at the interface on the cathode side at the end of the deposition. The mixing ratio of each component was continuously changed between these interfaces. The total thickness of the light-emitting layer was 30 nm. The concentration of each material was as follows: Pt-1 of 1% by weight, $Ir(ppy)_3$ of 19% by weight, and mCP of 80% by weight in an interface region of the light-emitting layer on the anode side; and Pt-1 of 19% by weight, $Ir(ppy)_3$ of 1% by weight, and mCP of 80% by weight in an interface region of the light-emitting layer on the cathode side.

(Preparation of Inventive Organic EL Element No. 3)

In the comparative organic EL element No. 1, the light-emitting layer was changed to the following layer.

Light-emitting layer: ternary element co-deposition of 1,4-bis-triphenylsilylbenzene (which is hereinafter referred to as BTPSB), the electron transporting light-emitting material Pt-1 and the hole transporting light-emitting material $Ir(ppy)_3$ was conducted while continuously changing the co-deposition amount thereof as the deposition was progressing. The deposition rate of each component was controlled so that the mixing ratio of Pt-1 was 0% by weight and the mixing ratio of $Ir(ppy)_3$ was 20% by weight at the interface on the anode side at the beginning of the deposition; and the mixing ratio of Pt-1 was 20% by weight and the mixing ratio of $Ir(ppy)_3$ was 0% by weight at the interface on the cathode side at the end of the deposition. The mixing ratio of each component was continuously changed between these interfaces. The total thickness of the light-emitting layer was 30 nm. The concentration of each material was as follows: Pt-1 of 1% by weight, $Ir(ppy)_3$ of 19% by weight, and BTPSB of 80% by weight in an interface region of the light-emitting layer on the anode side; and Pt-1 of 19% by weight, $Ir(ppy)_3$ of 1% by weight, and BTPSB of 80% by weight in an interface region of the light-emitting layer on the cathode side.

Chemical structures of the compounds used in Examples are shown below.

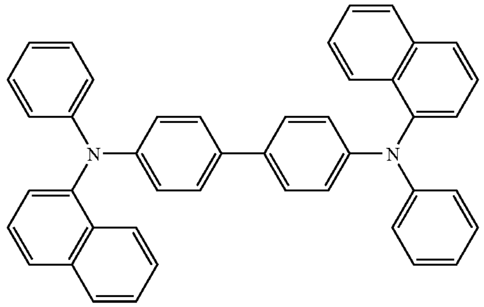

α-NPD

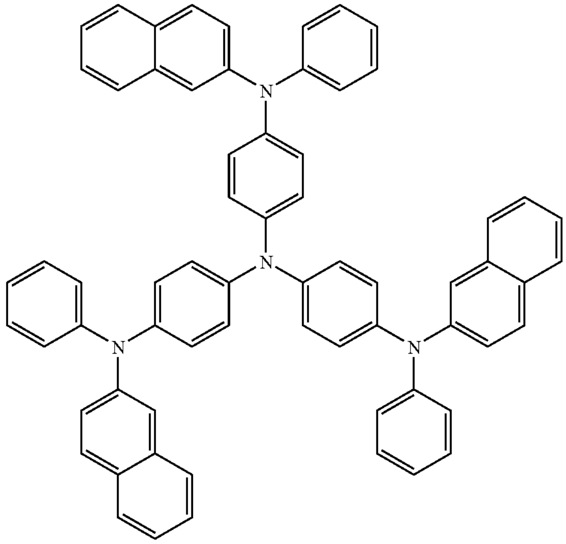

2-TNATA

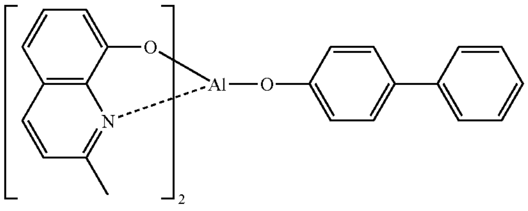

BAlq

2. Results of Performance Evaluation

The external quantum efficiency and drive durability of the obtained comparative organic EL elements and inventive organic EL elements were measured by the following means under the same conditions.

<<Method of Measuring External Quantum Efficiency>>

DC voltage was applied to the prepared light-emitting elements by the use of a source measuring unit, model 2400, manufactured by KEITHLEY to emit light having a brightness of 500 cd/$m^2$. The emission spectrum and light quantity thereof were measured by using a brightness photometer (trade name: SR-3, manufactured by Topcon Corporation), and the external quantum efficiency was calculated from the emission spectrum, the light quantity, and the electric current at the time of measurement.

Further, as an evaluation of light-emission efficiency at high-brightness luminescence, DC voltage was applied to the prepared light-emitting elements to emit light having a brightness of 10,000 cd/$m^2$, and the external quantum efficiency at this brightness was measured.

<<Method of Measuring Drive Durability>>

DC voltage was applied to each element to emit light having a brightness of 2,000 cd/$m^2$. While applying the current under this condition, each element was subjected to continuous driving, and the time until the brightness was reduced to 1,000 cd/$m^2$, which is expressed as a brightness half-value time, was measured. Drive durability is expressed in terms of the brightness half-value time.

The obtained results are shown in Table 2. The relative brightness half-value times are shown as relative values, with the relative brightness half-value time of comparative element No. 1 designated as 1.0. All of the inventive and comparative samples exhibit a green-light emission. All of the inventive organic EL element Nos. 1 to 3 exhibit unexpectedly high external quantum efficiency and excellent drive durability, as compared with the comparative organic EL element Nos. 1 and 2. Concerning the comparative elements, the external quantum efficiency decreases in a large amount in high-brightness luminescence (10,000 cd/$m^2$); whereas, concerning the inventive elements, the degree of decrease in external quantum efficiency is small even in high-brightness luminescence, so that light-emission efficiency at high brightness is excellent.

TABLE 2

| Element No. | External Quantum Efficiency (%) (at Brightness of 500 cd/$m^2$) | External Quantum Efficiency (%) (at Brightness of 10,000 cd/$m^2$) | Relative Brightness Half-Value Time (at Initial Brightness of 2,000 cd/$m^2$) |
|---|---|---|---|
| Comparative Element No. 1 | 11.2 | 5.5 | 1.0 |
| Comparative Element No. 2 | 12.5 | 5.1 | 2.0 |
| Inventive Element No. 1 | 14.3 | 7.8 | 3.5 |
| Inventive Element No. 2 | 15.2 | 8.2 | 4.0 |
| Inventive Element No. 3 | 16.2 | 8.9 | 2.5 |

Example 2

Organic EL elements were prepared in a similar manner to that in Example 1, except that, in Example 1, the light-emitting layer was changed to the following layer.

Comparative Element No. 3: mCP and iridium (III) bis[(4,6-di-fluorophenyl)-pyridinato-N,C2']picolinate (which is hereinafter referred to as FIrpic), which is a hole transporting light-emitting material, were co-deposited while changing the co-deposition amount thereof as the deposition was progressing. The deposition rate of each component was controlled so that the mixing ratio of FIrpic was 20% by weight at the interface on the anode side at the beginning of the deposition; and the mixing ratio of FIrpic was 0% by weight at the interface on the cathode side at the end of the deposition. The mixing ratio of each component was continuously changed between these interfaces. The total thickness of the light-emitting layer was 30 nm. The concentration of each material was as follows: FIrpic of 19% by weight, and mCP of 81% by weight in an interface region of the light-emitting layer on the anode side; and FIrpic of 1% by weight, and mCP of 99% by weight in an interface region of the light-emitting layer on the cathode side.

Comparative Element No. 4: mCP and electron transporting light-emitting material Pt-2 were co-deposited while increasing the co-deposition amount of Pt-2 with respect to mCP as the deposition was progressing. The deposition rate of each component was controlled so that the mixing ratio of Pt-2 was 0% by weight at the interface on the anode side at the beginning of the deposition; and the mixing ratio of Pt-2 was 20% by weight at the interface on the cathode side at the end of the deposition. The mixing ratio of each component was continuously changed between these interfaces. The total thickness of the light-emitting layer was 30 nm. The concentration of each material was as follows: Pt-2 of 1% by weight, and mCP of 99% by weight in an interface region of the light-emitting layer on the anode side; and Pt-2 of 19% by weight, and mCP of 81% by weight in an interface region of the light-emitting layer on the cathode side.

Inventive Element No. 4: ternary element co-deposition of mCP, Pt-2, and FIrpic was conducted while changing the co-deposition amount thereof as the deposition was progressing. The deposition rate of each component was controlled so that the mixing ratio of Pt-2 was 0% by weight and the mixing ratio of FIrpic was 20% by weight at the interface on the anode side at the beginning of the deposition; and the mixing ratio of Pt-2 was 20% by weight and the mixing ratio of FIrpic was 0% by weight at the interface on the cathode side at the end of the deposition. The mixing ratio of each component was continuously changed between these interfaces. The total thickness of the light-emitting layer was 30 nm. The concentration of each material was as follows: Pt-2 of 1% by weight, FIrpic of 19% by weight, and mCP of 80% by weight in an interface region of the light-emitting layer on the anode side; and Pt-2 of 19% by weight, FIrpic of 1% by weight, and mCP of 80% by weight in an interface region of the light-emitting layer on the cathode side.

Inventive Element No. 5: ternary element co-deposition of BTPSB, Pt-2, and FIrpic was conducted while changing the co-deposition amount thereof as the deposition was progressing. The deposition rate of each component was controlled so that the mixing ratio of Pt-2 was 0% by weight and the mixing ratio of FIrpic was 20% by weight at the interface on the anode side at the beginning of the deposition; and the mixing ratio of Pt-2 was 20% by weight and the mixing ratio of FIrpic was 0% by weight at the interface on the cathode side at the end of the deposition. The mixing ratio of each component was continuously changed between these interfaces. The total thickness of the light-emitting layer was 30 nm. The concentration of each material was as follows: Pt-2 of 1% by weight, FIrpic of 19% by weight, and BTPSB of 80% by weight in an interface region of the light-emitting layer on the anode side;

and Pt-2 of 19% by weight, FIrpic of 1% by weight, and BTPSB of 80% by weight in an interface region of the light-emitting layer on the cathode side.

The obtained samples were evaluated in a similar manner to that in Example 1. Results are shown in Table 3. The relative brightness half-value times are shown as relative values, with the relative brightness half-value time of comparative element No. 3 designated as 1.0.

Concerning the brightness half-value time, a half-value time at an initial brightness of 400 cd/$m^2$ was measured.

The samples in the Example exhibit a blue-light emission.

Both of the inventive organic EL element Nos. 4 and 5 exhibit unexpectedly high external quantum efficiency and excellent drive durability, as compared with the comparative organic EL element Nos. 3 and 4. In particular, durability of the inventive elements is two or more times as high as that of the comparative elements. Concerning the comparative elements, the external quantum efficiency decreases in a large amount in high-brightness luminescence (10,000 cd/$m^2$); whereas, concerning the inventive elements, the degree of decrease in external quantum efficiency is small even in high-brightness luminescence, so that light-emission efficiency at high brightness is excellent.

TABLE 3

| Element No. | External Quantum Efficiency (%) (at Brightness of 500 cd/$m^2$) | External Quantum Efficiency (%) (at Brightness of 10,000 cd/$m^2$) | Relative Brightness Half-Value Time (at Initial Brightness of 400 cd/$m^2$) |
|---|---|---|---|
| Comparative Element No. 3 | 8.2 | 4.5 | 1.0 |
| Comparative Element No. 4 | 8.6 | 4.8 | 3.5 |
| Inventive Element No. 4 | 11.3 | 7.1 | 8.0 |
| Inventive Element No. 5 | 12.4 | 7.6 | 7.0 |

Example 3

Organic EL elements were prepared in a similar manner to that in Example 1, except that, in Example 1, the light-emitting layer was changed to the following layer.

Comparative Element No. 5: ternary element co-deposition of host material ETH-1, the hole transporting light-emitting material $Ir(ppy)_3$ and the electron transporting light-emitting material Pt-1 was conducted so that the concentration of $Ir(ppy)_3$ and Pt-1 was kept constant with respect to the concentration of ETH-1, and thereby the light-emitting layer was formed. The deposition rate of each light-emitting material was controlled so that the ratio of each light-emitting material was 10% by weight of the entire light-emitting layer (the light-emitting materials were included in an amount of 20% by weight in total.). The concentration of each light-emitting material was kept constant in the direction of film thickness. The total thickness of the light-emitting layer was 30 nm.

Comparative Element No. 6: ternary element co-deposition of host material HTH-1, the hole transporting light-emitting material $Ir(ppy)_3$ and the electron transporting light-emitting material Pt-1 was conducted so that the concentration of $Ir(ppy)_3$ and Pt-1 was kept constant with respect to the concentration of HTH-1, and thereby the light-emitting layer was formed. The deposition rate of each light-emitting material was controlled so that the ratio of each light-emitting material was 10% by weight of the entire light-emitting layer (the light-emitting materials were included in an amount of 20% by weight in total.). The concentration of each light-emitting material was kept constant in the direction of film thickness. The total thickness of the light-emitting layer was 30 nm.

Comparative Element No. 7: quaternary element co-deposition of the hole transporting host material HTH-1, the electron transporting host material ETH-1, the hole transporting light-emitting material $Ir(ppy)_3$ and the electron transporting light-emitting material Pt-1 was conducted while controlling the deposition rate so that the mixing ratio of each material was as follows: HTH-1 of 40% by weight, ETH-1 of 40% by weight, $Ir(ppy)_3$ of 10% by weight, and Pt-1 of 10% by weight. The concentration of each material was kept constant in the direction of film thickness. The total thickness of the light-emitting layer was 30 nm.

Inventive Element No. 6: ternary element co-deposition of ETH-1, the electron transporting light-emitting material Pt-1 and the hole transporting light-emitting material $Ir(ppy)_3$ was conducted while changing the co-deposition amount thereof as the deposition was progressing. The deposition rate of each component was controlled so that the mixing ratio of Pt-1 was 0% by weight and the mixing ratio of $Ir(ppy)_3$ was 20% by weight in the region close to the hole transport layer at the beginning of the deposition; and the mixing ratio of Pt-1 was 20% by weight and the mixing ratio of $Ir(ppy)_3$ was 0% by weight in the region close to the electron transport layer at the end of the deposition. The mixing ratio of each component was continuously changed between these regions. The total thickness of the light-emitting layer was 30 nm.

Inventive Element No. 7: ternary element co-deposition of HTH-1, the electron transporting light-emitting material Pt-1 and the hole transporting light-emitting material $Ir(ppy)_3$ was conducted while changing the co-deposition amount thereof as the deposition was progressing. The deposition rate of each component was controlled so that the mixing ratio of Pt-1 was 0% by weight and the mixing ratio of $Ir(ppy)_3$ was 20% by weight in the region close to the hole transport layer at the beginning of the deposition; and the mixing ratio of Pt-1 was 20% by weight and the mixing ratio of $Ir(ppy)_3$ was 0% by weight in the region close to the electron transport layer at the end of the deposition. The mixing ratio of each component was continuously changed between these regions. The total thickness of the light-emitting layer was 30 nm.

Inventive Element No. 8: quaternary element co-deposition of ETH-1, HTH-1, Pt-1, and $Ir(ppy)_3$ was conducted while changing the co-deposition amount thereof as the deposition was progressing. The deposition rate of each component was controlled so that the mixing ratios of ETH-1 and Pt-1 were each 0% by weight and the mixing ratios of HTH-1 and $Ir(ppy)_3$ were 80% by weight and 20% by weight, respectively, in the region close to the hole transport layer at the beginning of the deposition; and the mixing ratios of ETH-1 and Pt-1 were 80% by weight and 20% by weight, respectively, and the mixing ratios of HTH-1 and $Ir(ppy)_3$ were each 0% by weight in the region close to the electron transport layer at the end of the deposition. The mixing ratio of each component was continuously changed between these regions. The total thickness of the light-emitting layer was 30 nm.

The obtained samples were evaluated in a similar manner to that in Example 2. Results are shown in Table 4. The relative brightness half-value times are shown as relative values, with the relative brightness half-value time of comparative element No. 5 designated as 1.0. All of the samples in the Example exhibit a blue-light emission.

All of the inventive organic EL element Nos. 6 to 8 exhibit unexpectedly high external quantum efficiency and excellent drive durability, as compared with the comparative organic EL element Nos. 5 to 7. In particular, with respect to the drive durability, the inventive elements exhibit high durability which is two or more times as high as that of the comparative elements. Concerning the comparative elements, the external quantum efficiency decreases in a large amount in high-brightness luminescence (10,000 cd/$m^2$); whereas, concerning the inventive elements, the degree of decrease in external quantum efficiency is small even in high-brightness luminescence, so that light-emission efficiency at high brightness is excellent. In particular, the inventive organic EL element No. 8 exhibits most excellent performance.

TABLE 4

| Element No. | External Quantum Efficiency (%) (at Brightness of 500 cd/$m^2$) | External Quantum Efficiency (%) (at Brightness of 10,000 cd/$m^2$) | Relative Brightness Half-Value Time (at Initial Brightness of 400 cd/$m^2$) |
|---|---|---|---|
| Comparative Element No. 5 | 11.5 | 5.6 | 1.0 |
| Comparative Element No. 6 | 11.7 | 5.3 | 1.5 |
| Comparative Element No. 7 | 12.1 | 6.1 | 1.5 |
| Inventive Element No. 6 | 13.6 | 7.9 | 3.3 |
| Inventive Element No. 7 | 13.8 | 7.9 | 3.2 |
| Inventive Element No. 8 | 14.1 | 8.6 | 5.2 |

What is claimed is:

1. An organic electroluminescence element, comprising:

an organic layer, wherein the organic layer comprises a light-emitting layer between a pair of electrodes, wherein the light-emitting layer comprises (i) at least two light-emitting materials having different Ea (electron affinity) values and (ii) at least one host material, wherein a concentration of the light-emitting material having a larger Ea value among the at least two light-emitting materials in the light-emitting layer gradually decreases from a cathode side toward an anode side in the light-emitting layer, and wherein a concentration of the light-emitting material having a smaller Ea value among the at least two light-emitting materials in the light-emitting layer gradually decreases from the anode side toward the cathode side.

2. The organic electroluminescence element according to claim 1, wherein a ratio of a concentration of the light-emitting material having a larger Ea value in an interface region of the light-emitting layer on the anode side to a concentration thereof in an interface region of the light-emitting layer on the cathode side (concentration of light-emitting material having larger Ea value in interface region of light-emitting layer on anode side/concentration of light-emitting material having larger Ea value in interface region of light-emitting layer on cathode side) is from 0% to 50%, and a ratio of a concentration of the light-emitting material having a smaller Ea value in the interface region of the light-emitting layer on the cathode side to a concentration thereof in the interface region of the light-emitting layer on the anode side (concentration of light-emitting material having smaller Ea value in interface region of light-emitting layer on cathode side/concentration of light-emitting material having smaller Ea value in interface region of light-emitting layer on anode side) is from 0% to 50%.

3. The organic electroluminescence element according to claim 1, wherein the light-emitting layer comprises at least two host materials having different Ea values, a concentration of a host material having a larger Ea value among the at least two host materials in the light-emitting layer gradually decreases from the cathode side toward the anode side in the light-emitting layer, and a concentration of a host material having a smaller Ea value among the at least two host materials in the light-emitting layer gradually decreases from the anode side toward the cathode side.

4. The organic electroluminescence element according to claim 3, wherein a ratio of a concentration of the host material having a larger Ea value in an interface region of the light-emitting layer on the anode side to a concentration thereof in an interface region of the light-emitting layer on the cathode side (concentration of host material having larger Ea value in interface region of light-emitting layer on anode side/concentration of host material having larger Ea value in interface region of light-emitting layer on cathode side) is from 0% to 50%, and a ratio of a concentration of the host material having a smaller Ea value in the interface region of the light-emitting layer on the cathode side to a concentration thereof in the interface region of the light-emitting layer on the anode side (concentration of host material having smaller Ea value in interface region of light-emitting layer on cathode side/concentration of host material having smaller Ea value in interface region of light-emitting layer on anode side) is from 0% to 50%.

5. The organic electroluminescence element according to claim 1, wherein the light-emitting layer comprises at least two host materials having different Ip values, a concentration of a host material having a smaller Ip value among the at least two host materials in the light-emitting layer gradually decreases from the anode side toward the cathode side in the light-emitting layer, and a concentration of a host material having a larger Ip value among the at least two host materials in the light-emitting layer gradually decreases from the cathode side toward the anode side.

6. The organic electroluminescence element according to claim 5, wherein a ratio of a concentration of the host material having a larger Ip value in an interface region of the light-emitting layer on the anode side to a concentration thereof in an interface region of the light-emitting layer on the cathode side (concentration of host material having larger Ip value in interface region of light-emitting layer on anode side/concentration of host material having larger Ip value in interface region of light-emitting layer on cathode side) is from 0% to 50%, and a ratio of a concentration of the host material having a smaller Ip value in the interface region of the light-emitting layer on the cathode side to a concentration thereof in the interface region of the light-emitting layer on the anode side (concentration of host material having smaller Ip value in interface region of light-emitting layer on cathode side/concentration of host material having smaller Ip value in interface region of light-emitting layer on anode side) is from 0% to 50%.

7. The organic electroluminescence element according to claim 1, wherein at least one of the at least two light-emitting materials is a phosphorescent light-emitting material.

8. The organic electroluminescence element according to claim 1, wherein at least one of the at least two light-emitting materials is a metal complex having platinum as a central metal.

9. The organic electroluminescence element according to claim 1, wherein at least one of the at least two light-emitting materials is a metal complex having iridium as a central metal.

10. The organic electroluminescence element according to claim 1, wherein the light-emitting material having a larger Ea value is a metal complex having platinum as a central metal, and the light-emitting material having a smaller Ea value is a metal complex having iridium as a central metal.

11. The organic electroluminescence element according to claim 1, wherein a difference in maximum emission wavelengths between the at least two light-emitting materials is 30 nm or less.

12. The organic electroluminescence element according to claim 1, wherein an Eg value (an energy gap value) expressed by a difference between an Ip value and an Ea value of the host material is larger by 0.5 eV or more than any Eg values of the at least two light-emitting materials.

13. An organic electroluminescence element, comprising: an organic layer, wherein the organic layer comprises a light-emitting layer between a pair of electrodes, wherein the light-emitting layer comprises (i) at least two light-emitting materials having different Ip (ionization potential) values and (ii) at least one host material, wherein a concentration of the light-emitting material having a smaller Ip value among the at least two light-emitting materials in the light-emitting layer gradually decreases from an anode side toward a cathode side in the light-emitting layer, and wherein a concentration of the light-emitting material having a larger Ip value among the at least two light-emitting materials in the light-emitting layer gradually decreases from the cathode side toward the anode side.

14. The organic electroluminescence element according to claim 13, wherein a ratio of a concentration of the light-emitting material having a larger Ip value in an interface region of the light-emitting layer on the anode side to a concentration thereof in an interface region of the light-emitting layer on the cathode side (concentration of light-emitting material having larger Ip value in interface region of light-emitting layer on anode side/concentration of light-emitting material having larger Ip value in interface region of light-emitting layer on cathode side) is from 0% to 50%, and a ratio of a concentration of the light-emitting material having a smaller Ip value in the interface region of the light-emitting layer on the cathode side to a concentration thereof in the interface region of the light-emitting layer on the anode side (concentration of light-emitting material having smaller Ip value in interface region of light-emitting layer on cathode side/concentration of light-emitting material having smaller Ip value in interface region of light-emitting layer on anode side) is from 0% to 50%.

15. The organic electroluminescence element according to claim 13, wherein the light-emitting layer comprises at least two host materials having different Ea values, a concentration of a host material having a larger Ea value among the at least two host materials in the light-emitting layer gradually decreases from the cathode side toward the anode side of the light-emitting layer, and a concentration of a host material having a smaller Ea value among the at least two host materials in the light-emitting layer gradually decreases from the anode side toward the cathode side.

16. The organic electroluminescence element according to claim 15, wherein a ratio of a concentration of the host material having a larger Ea value in an interface region of the light-emitting layer on the anode side to a concentration thereof in an interface region of the light-emitting layer on the cathode side (concentration of host material having larger Ea value in interface region of light-emitting layer on anode side/concentration of host material having larger Ea value in interface region of light-emitting layer on cathode side) is from 0% to 50%, and a ratio of a concentration of the host material having a smaller Ea value in the interface region of the light-emitting layer on the cathode side to a concentration thereof in the interface region of the light-emitting layer on the anode side (concentration of host material having smaller Ea value in interface region of light-emitting layer on cathode side/concentration of host material having smaller Ea value in interface region of light-emitting layer on anode side) is from 0% to 50%.

17. The organic electroluminescence element according to claim 13, wherein the light-emitting layer comprises at least two host materials having different Ip values, a concentration of a host material having a smaller Ip value among the at least two host materials in the light-emitting layer gradually decreases from the anode side toward the cathode side in the light-emitting layer, and a concentration of a host material having a larger Ip value among the at least two host materials in the light-emitting layer gradually decreases from the cathode side toward the anode side.

18. The organic electroluminescence element according to claim 17, wherein a ratio of a concentration of the host material having a larger Ip value in an interface region of the light-emitting layer on the anode side to a concentration thereof in an interface region of the light-emitting layer on the cathode side (concentration of host material having larger Ip value in interface region of light-emitting layer on anode side/concentration of host material having larger Ip value in interface region of light-emitting layer on cathode side) is from 0% to 50%, and a ratio of a concentration of the host material having a smaller Ip value in the interface region of the light-emitting layer on the cathode side to a concentration thereof in the interface region of the light-emitting layer on the anode side (concentration of host material having smaller Ip value in interface region of light-emitting layer on cathode side/concentration of host material having smaller Ip value in interface region of light-emitting layer on anode side) is from 0% to 50%.

19. The organic electroluminescence element according to claim 13, wherein at least one of the at least two light-emitting materials is a phosphorescent light-emitting material.

20. The organic electroluminescence element according to claim 13, wherein at least one of the at least two light-emitting materials is a metal complex having platinum as a central metal.

21. The organic electroluminescence element according to claim 13, wherein at least one of the at least two light-emitting materials is a metal complex having iridium as a central metal.

22. The organic electroluminescence element according to claim 13, wherein the light-emitting material having a larger Ip value is a metal complex having platinum as a central metal, and the light-emitting material having a smaller Ip value is a metal complex having iridium as a central metal.

23. The organic electroluminescence element according to claim 13, wherein a difference in maximum emission wavelengths between the at least two light-emitting materials is 30 nm or less.

24. The organic electroluminescence element according to claim 13, wherein an Eg value (an energy gap value) expressed by a difference between an Ip value and an Ea value of the host material is larger by 0.5 eV or more than any Eg values of the at least two light-emitting materials.

* * * * *